United States Patent
Furuya

(10) Patent No.: US 7,098,711 B2
(45) Date of Patent: Aug. 29, 2006

(54) SEMICONDUCTOR DEVICE, RECEIVER CIRCUIT, AND FREQUENCY MULTIPLIER CIRCUIT

(75) Inventor: Yasunari Furuya, Naganoken (JP)

(73) Assignee: Seiko Epson Corporation, (JP)

( * ) Notice: Subject to any disclaimer, the term of this patent is extended or adjusted under 35 U.S.C. 154(b) by 55 days.

(21) Appl. No.: 10/922,381

(22) Filed: Aug. 19, 2004

(65) Prior Publication Data

US 2005/0073344 A1    Apr. 7, 2005

(30) Foreign Application Priority Data

Aug. 21, 2003  (JP)  .............................. 2003-297650

(51) Int. Cl.
*H03L 7/06* (2006.01)

(52) U.S. Cl. ...................... 327/158; 327/159; 327/161

(58) Field of Classification Search ...................... None
See application file for complete search history.

(56) References Cited

U.S. PATENT DOCUMENTS

| 4,358,741 | A | * | 11/1982 | Nardin | ............................ | 331/2 |
| 5,712,884 | A | * | 1/1998 | Jeong | ......................... | 375/375 |
| 6,259,294 | B1 | * | 7/2001 | Murakami et al. | .......... | 327/277 |
| 6,417,706 | B1 | * | 7/2002 | Kondo | ........................ | 327/158 |
| 6,737,901 | B1 | * | 5/2004 | Hein et al. | .................. | 327/270 |
| 6,788,119 | B1 | * | 9/2004 | Hyland et al. | .............. | 327/158 |
| 2003/0080783 | A1 | | 5/2003 | Kozaki | ........................ | 327/22 |

FOREIGN PATENT DOCUMENTS

| JP | 2002-232490 | 8/2002 |
| JP | 2003-124787 | 4/2003 |

\* cited by examiner

*Primary Examiner*—Terry D. Cunningham
*Assistant Examiner*—An T. Luu
(74) *Attorney, Agent, or Firm*—Harness, Dickey & Pierce, P.L.C.

(57) ABSTRACT

A delay circuit is provided including: $2n$ (n is a natural number) unit delay circuits for delaying an input clock signal (with the period of T) in accordance with a delay setting signal and generating and outputting $2n$ phases of delayed clock signals; a phase locked circuit for locking phases of the input clock signal and an output clock signal of a predetermined one of the unit delay circuits so as to be in phase and for outputting the delay amount setting signal for causing each of the first to the last stages of the unit delay circuits to delay the phase of an output clock signal by $T/2n$; and a correction circuit to which the input clock signal and the delay amount setting signal are input for generating a corrected clock signal by delaying the input clock signal and outputting it to the delay circuit.

11 Claims, 18 Drawing Sheets input clock versus NB characteristics

DLL bias characteristics clock delay bias circuit characteristics varicap characteristics

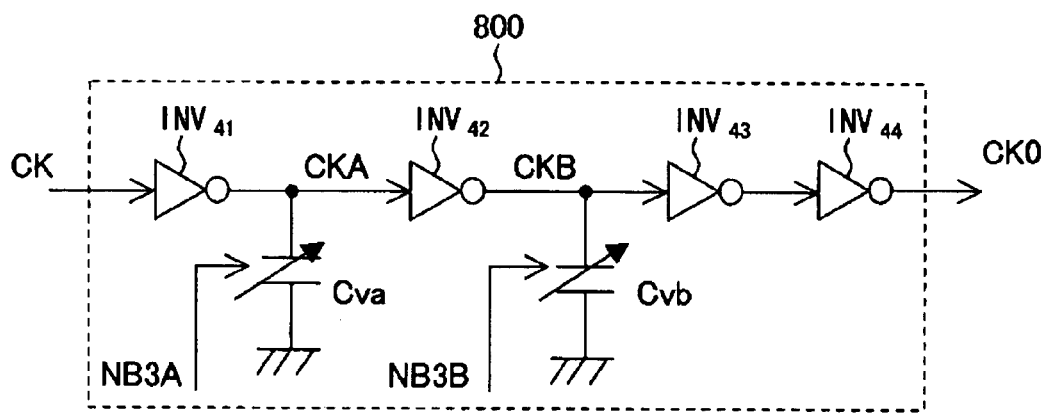
FIG. 13A
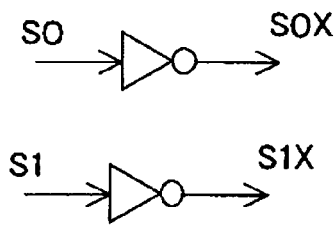
FIG. 13B
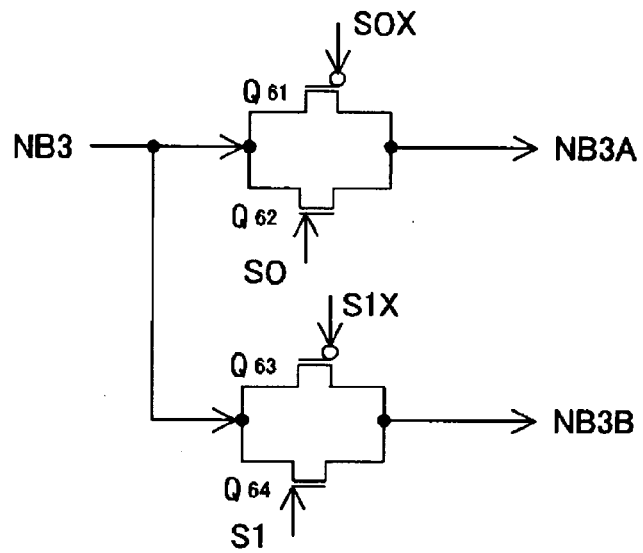
FIG. 13C
| S1 | S0 | Cvb | Cva | total capacitance value |
|----|----|-----|-----|-------------------------|
| 0  | 0  | off | off | 0                       |
| 0  | 1  | off | on  | 1(reference value)      |
| 1  | 0  | on  | off | 2 fold                  |
| 1  | 1  | on  | on  | 3 fold                  |
FIG. 14

SEMICONDUCTOR DEVICE, RECEIVER CIRCUIT, AND FREQUENCY MULTIPLIER CIRCUIT

RELATED APPLICATIONS

This application claims priority to Japanese Patent Application No. 2003-297650 filed Aug. 21, 2003 which is hereby expressly incorporated by reference herein in its entirety.

BACKGROUND

1. Field of the Invention

The present invention relates to a semiconductor device, a receiver circuit and a frequency multiplier circuit, and particularly to a receiver circuit part corresponding to a receiver of a Low Voltage Differential Signal (LVDS) circuit capable of low voltage differential transmission.

2. Background

In recent years, a low voltage differential signal transmission technology using so-called LVDS circuits has become popular for attempting to satisfy demands of high speed data transmission.

The LVDS is a standard of cables for connecting, for example, graphic controllers of personal computers with liquid crystal displays. Since a low voltage and a differential signal are used, it has features of preventing Electro-Magnetic Interference (EMI) noises from being emitted and of being durable against foreign noises (See for example Japanese Unexamined Patent Publication No. 2002-232490).

The LVDS is mainly used for image data transmission in personal computers, and frequencies of transmission clock (dot clock) signals differ in accordance with image sizes (i.e., panel sizes). The frequencies of the clock signals are typically in a range between 20 MHz and 160 MHz.

The LVDS circuit is provided with data lines for, for example, four channels and a clock line parallel to each other between a driver (also referred to as a transceiver) on the personal computer side and a receiver on the liquid crystal panel side, the clock line transmitting a clock signal CK having a period corresponding to one dot clock (the period of one dot clock corresponds a duration of, for example, seven data bits transmitted through the data lines, namely seven periods thereof) of the liquid crystal panel. The data lines for one channel are composed of a pair of lines each transmitting the data signal having a phase opposite to each other. The pair of transmission lines for transmitting the data signals opposite in phase to each other is referred to as balanced transmission lines.

As described above, the LVDS circuit is configured to transmit one signal with a pair of transmission lines.

The receiver, on a receiving side of the LVDS circuit, is provided with four sampling circuits as data latch circuits, each receiving one of the four channels of serial data respectively transmitted through the four channels of data lines and converting the serial data into parallel data, and a clock generator circuit that receives the clock signal transmitted through one channel of the clock lines and generates sampling clock signals CK1 through CK7 used for data latch for converting by one clock (CK) unit (i.e., seven data clock signals) the serial data respectively input to the four sampling circuits into the parallel data.

As the clock generator circuit, a Delay Locked Loop (DLL) circuit is used. As the sampling circuit, a serial-parallel converter circuit is used that is capable of sampling seven unit data contained in one clock unit forming the serial input data.

The DLL circuit is composed of a phase comparator circuit, a charge pump circuit, a low pass filter (hereinafter referred to as LPF), a DLL bias circuit, a delay circuit including a plurality of unit delay circuits, and a sampling clock generating circuit. In this circuit, the unit delay circuits are connected in series, wherein at least one of the former unit delay circuits are provided as, for example, dummies, the clock signal CK is input to at least one of the unit delay circuits of the former dummies, the input signal of the first unit delay circuit except the dummies is input to one of input terminals of the phase comparator, and the output signal of the last unit delay circuit is fed back to the other of the input terminals of the phase comparator, and clock signals with multiple phases are output from the first through the last unit delay circuits except the dummies.

The amount of delay in each of the unit delay circuits changes in accordance with a control voltage and controlled so that the clock signals CK with multiple phases output form the first unit delay circuit and the last unit delay circuit except the dummies are in phase. As a result, the seven clock signals having phases shifted by a seventh of the period with each other can be generated. Then, the non-overlapping (with no temporal overlapping) sampling clock signals CK1 through CK7 are generated by the sampling clock generator circuit based on the seven clock signals with multiple phases, which can be supplied to the serial-parallel converter circuit, the sampling circuit, as signals for data sampling.

Conventional DLL circuits have a problem that the delays of the output clock signals from the DLL circuits with respect to the input clock signals to the DLL circuits vary in accordance with frequencies of the input clock signals. This causes a further problem that, when sampling the input data by the output clock signals from the DLL circuits, the setup time or the hold time is not sufficient to correctly latch the data.

Accordingly, the present invention addresses the above problem and has an advantage of providing a semiconductor device, a receiver circuit, and a frequency multiplier circuit capable of keeping the delay of the output clock signal from the DLL circuit with respect to the input clock signal to the DLL circuit to stably maintain the setup time and the hold time for the input data.

SUMMARY

A semiconductor device according to the present invention comprises a delay circuit including 2n (n is a natural number) unit delay circuits, and for delaying an input clock signal (with the period of T) in accordance with a delay amount setting signal for controlling the delay amount and generating and outputting 2n phases of delayed clock signals, a phase locked circuit for locking phases of the input clock signal and an output clock signal of a predetermined one of the unit delay circuits so as to be in phase with each other and for outputting the delay amount setting signal for causing each of the first to the last stages of the unit delay circuits to delay the phase of an output clock signal by T/2n, and a correction circuit to which the input clock signal and the delay amount setting signal are input, generates a corrected clock signal by delaying the input clock signal, and output the corrected clock signal to the delay circuit.

According to the above configuration of the present invention, the delay of the output clock signal of the final stage with respect to the input clock signal to the first stage of the delay circuit can be maintained even when the input clock frequency alters, which enables stably providing enough setup time and enough hold time of the input data.

The semiconductor device according to the present invention can further comprise a sampling signal generating circuit for generating a sampling signal that takes a first level between $(2m-1)T/2n$ and $mT/n$ (m is a natural number) based on two or more of the delayed clock signals.

According to the above configuration, sampling clock signals without any overlaps can be generated and output by the sampling clock generating circuit based on the 2n phases of delayed clock signals.

In the semiconductor device according to the present invention, the correction circuit comprises a delay amount control circuit which the delay amount setting signal is input to and outputs a delay amount control signal, and a clock correction circuit to which the input clock signal and the delay amount control signal are input and generates the corrected clock signal and outputs the corrected clock signal to the delay circuit.

In the semiconductor device according to the present invention, the delay circuit comprises a sub-delay circuit comprising one or more of the unit delay circuits to which the corrected clock signal is input, and a main-delay circuit comprising 2n of the unit delay circuits to which an output of the sub-delay circuit is input and generates and outputs 2n phases of the delayed clock signals.

The semiconductor device according to the present invention can further comprise a bias circuit for generating first and second delay amount setting signals in accordance with the delay amount control signal and supplying the first and the second delay amount setting signals to the delay circuit.

According to the above configuration, the delay amount of the delay circuit can be more precisely controlled based on the delay amount control signal.

In the semiconductor device according to the present invention, the correction circuit generates and outputs the corrected clock signal in accordance with the frequency of the input clock signal.

According to the above configuration, the problem that the delay amount of the output clock of the final stage with respect to the input clock to the first stage alters when the input clock frequency changes can be eliminated.

In the semiconductor device according to the present invention, the correction circuit generates and outputs the corrected clock signal in accordance with the delay amount setting signal.

According to the above configuration, since the delay amount setting signal is equivalent to the change occurring when the input clock frequency changes, the input clock can be controlled in the delay (corrected in the delay) using the delay amount setting signal.

In the semiconductor device according to the present invention, the clock correction circuit is composed of a variable resistor, and the delay amount control circuit is composed of a circuit for controlling a bias of the variable resistor.

According to the above configuration, the variable resistance can be used as a means for controlling (correcting) the input clock signal in the delay.

In the semiconductor device according to the present invention, the clock correction circuit is composed of a current control device, and the delay amount control circuit is composed of a circuit for controlling a bias of the current control device.

According to the above configuration, the current control element can be used as a means for controlling (correcting) the input clock signal in the delay.

A receiver circuit according to the present invention comprises any of the semiconductor devices described above.

According to the above configuration of the present invention, the delay of the output clock signal of the final stage with respect to the input clock signal to the first stage of the delay circuit can be maintained even when the input clock frequency alters, which enables realizing a receiver circuit capable of stably providing enough setup time and enough hold time of the input data.

A frequency multiplier circuit according to the present invention comprises any of the semiconductor devices described above.

According to the above configuration of the present invention, the delay of the output clock signal of the final stage with respect to the input clock signal to the first stage of the delay circuit can be maintained even when the input clock frequency alters, which enables realizing a frequency multiplier circuit useful for obtaining input data or the like.

BRIEF DESCRIPTION OF THE DRAWINGS

FIGS. 13(A) through 13(C) are circuit diagrams showing another configuration example (a delay amount changeable type) of a clock delay correction circuit.

FIG. 14 is a table showing a relationship between settings of setting pins S0, S2 and capacitance values Cva, Cvb in a clock delay correction circuit shown in FIG. 13.

DETAILED DESCRIPTION

An embodiment of the present invention is described referring to the accompanying drawings.

FIRST EMBODIMENT

Figure 1:
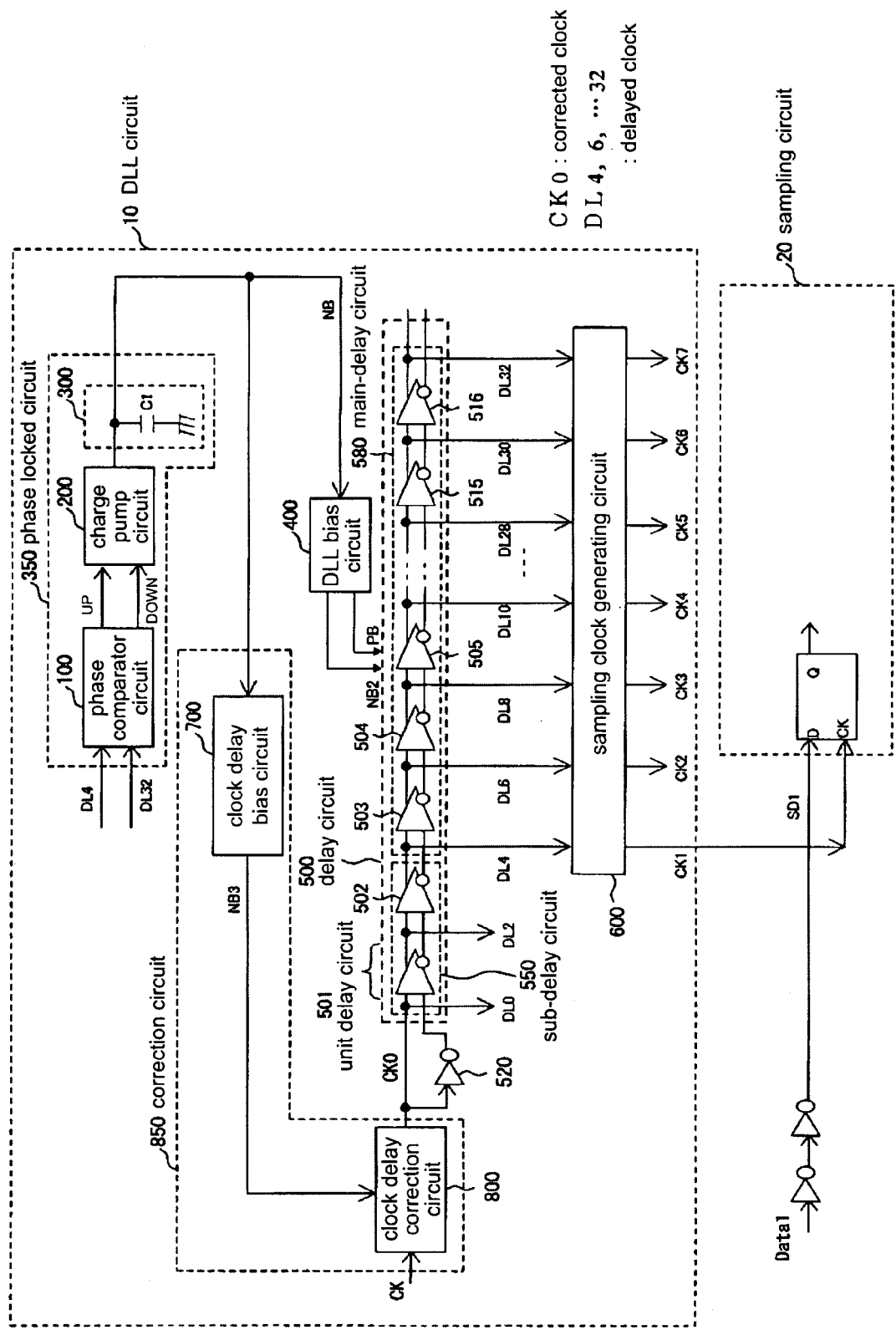
FIG. 1 is a circuit diagram of a semiconductor device according to a first embodiment of the present invention.

FIG. 1 shows a circuit diagram of a semiconductor device according to a first embodiment of the present invention.

The semiconductor device shown in FIG. 1 is composed mainly of a DLL circuit 10 used as a clock signal generator circuit and a sampling circuit 20 used as a data latch circuit.

Figure 16:
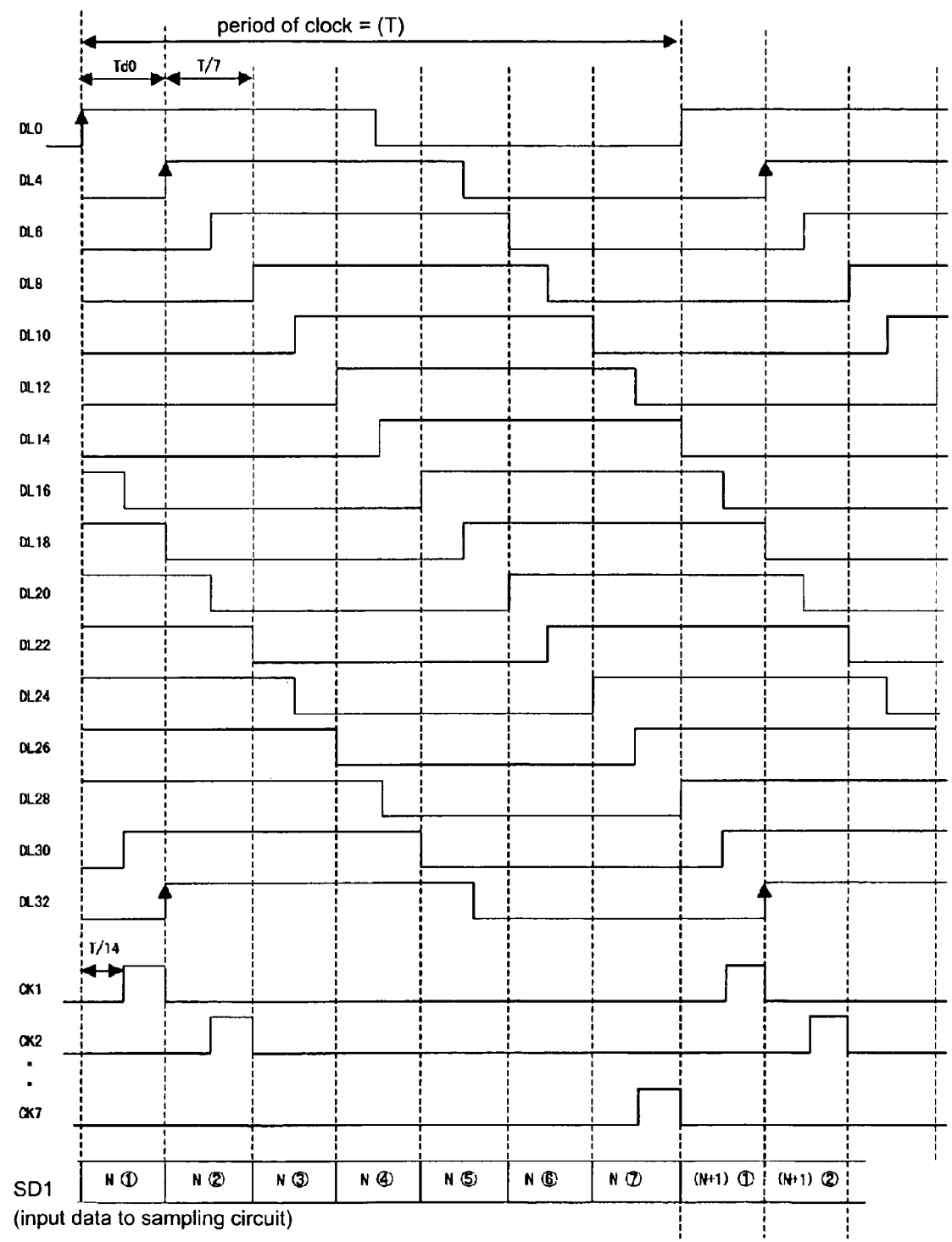
FIG. 16 is a timing chart showing relationships between each of data N1 through N7 of an input data SD1 to a sampling circuit and each of sampling clock signals CK1 through CK7.

Assuming that the period of the input clock signal CK is T, 2n unit delay circuits, as delay element circuits, are necessary for generating n phases of sampling clock signals (because, as a sampling clock CK1 shown in FIG. 16, the timing resolution of T/(2n) is necessary to place the rising edges of clock signals in the center of respective data bits). In FIG. 1, fourteen (14) steps of unit delay circuits are provided between signals DL4 through DL32 to generate the seven phases of clock signals. Therefore, the two steps of the unit delay circuits make a delay corresponding to the delay of one phase (the delay of T/7) of the seven phases of clock signals.

The DLL circuit 10 is composed mainly of a phase locked circuit 350 including a phase comparator circuit 100, a charge pump circuit 200, and a LPF 300, a DLL bias circuit 400 as a bias circuit, a delay circuit 500 comprising a plurality of unit delay circuits 501 through 516 and including a sub-delay circuit 550 including one or more of the unit delay circuits (in case of FIG. 1, two unit delay circuits 501 and 502) and a main-delay circuit 580 including 2n unit delay circuits (in case of FIG. 1, fourteen (14) unit delay circuits), a sampling clock generating circuit 600 as a sampling signal generating circuit, and a correction circuit 850 including a clock delay bias circuit 700 as a delay amount control circuit and a clock delay correction circuit 800 as a clock correction circuit.

The delay circuit 500, in which each unit delay circuit comprises a delay amount control circuit for controlling the respective delay amount based on the control voltage, includes the sub-delay circuit 550 having the unit delay circuits 501 and 502 functioning as dummies and the main-delay circuit 580 having 2n (n is a natural number) of unit delay circuits 503 through 516, and delays the clock signal (with the period of T) input thereto to generate and output 2n phases of multi-phase clock signals.

The differential signals (a pair of positive and negative signals) having opposite phases to each other differentially transmitted from a driver (not shown in the drawings) of the LVDS circuit are detected as a difference signal (i.e., one of the signals of the opposite phases being inverted and added to the other to be output) by a differential circuit (not shown in the drawings) in a receiver of the LVDS circuit to be converted from the differential clock signals into a single clock signal that is a full-swing single-end signal (here, the full-swing signal is a signal having the maximum amplitude the H and L levels can take, for example, 3.3V and 0V of the H and L levels, respectively), and supplied to the DLL circuit 10 as an input clock signal CK.

This input clock signal CK is controlled by passing through the clock delay correction circuit 800 to be delayed, and input to one of the input terminals of the unit delay circuit 501 as a positive clock signal CK0 of the differential signals while the negative clock signal made by inverting the positive clock signal CK0 by the inverter 520 is input to the other of the input terminals of the unit delay circuit 501 as the other signal of the differential signals. The delay circuit 500 is made of a plurality of unit delay circuits, the unit delay circuits 501 through 516 being connected in series.

Figure 2:
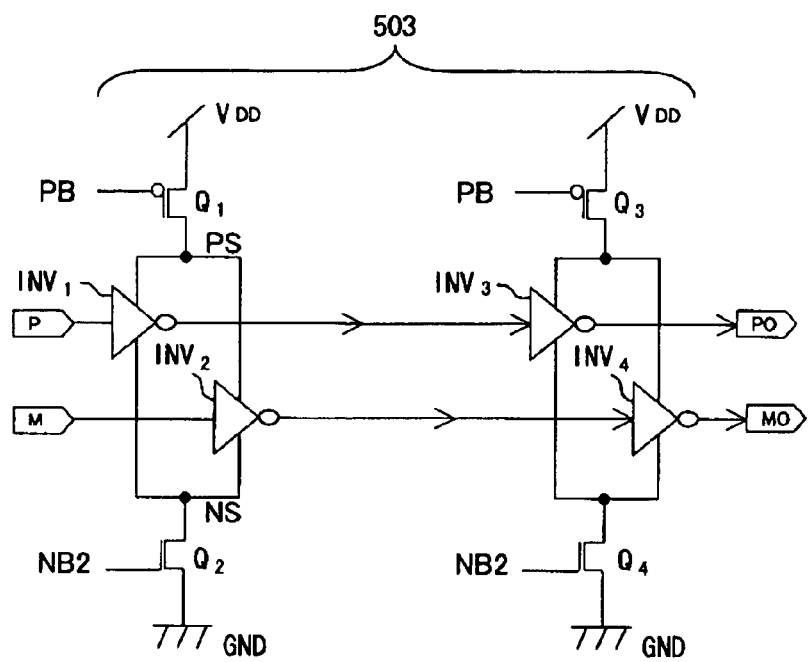
FIG. 2 is a circuit diagram showing a configuration example of a unit delay circuit.

Each of the plurality of unit delay circuits 501 through 516 (e.g., the unit delay circuit 503), as shown in FIG. 2, has a first parallel circuit for inverting signals, the first parallel circuit being formed of an inverter INV1 that receives the positive clock signal P and output it after inverting and an inverter INV2 that receives the negative clock signal M and output it after inverting connected in parallel in their power source lines, wherein the positive side connection point of the first parallel circuit is connected to the direct current voltage source $V_{DD}$ through the drain and the source of the PMOS transistor Q1 used for controlling the delay amount and the negative side connection point of the first parallel circuit is connected to the reference potential point GND through the drain and the source of the NMOS transistor Q2 used for controlling the delay amount. The bias voltage PB output from the DLL bias circuit 400 is input to the gate of the PMOS transistor Q1 used for controlling the delay amount and the bias voltage NB2 output from the DLL bias circuit 400 is input to the gate of the NMOS transistor Q2 used for controlling the delay amount. The amount of current flowing through each of the PMOS transistor Q1 and the NMOS transistor Q2 is controlled by the bias voltages PB and NB2, respectively. However, since the input and the output of each of the inverter INV1 and the inverter INV2 are in an inverted relationship, another structure including a second parallel circuit for inverting signals substantially the same as the above is additionally provided to make the input and output relationship positive as a whole. Namely, an inverter INV3 that receives the output signal from the inverter INV1 and inverts it to output a positive clock signal P0 and an inverter INV4 that receives the output signal from the inverter INV2 and inverts it to output a negative clock signal MO are connected in parallel in their power source lines to form the second parallel circuit for inverting signals, wherein the positive side connection point of the second parallel circuit is connected to the direct current voltage source $V_{DD}$ through the drain and the source of the PMOS transistor Q3 used for controlling the delay amount and the negative side connection point of the second parallel circuit is connected to the reference potential point GND through the drain and the source of the NMOS transistor Q4 used for controlling the delay amount. The bias voltage PB output from the DLL bias circuit 400 is input to the gate of the PMOS transistor Q3 used for controlling the delay amount and the bias voltage NB2 output from the DLL bias circuit 400 is input to the gate of the NMOS transistor Q4 used for controlling the delay amount. The amount of current flowing through each of the PMOS transistor Q3 and the NMOS transistor Q4 is controlled by the bias voltages PB and NB2, respectively.

The phase comparator circuit 100, the charge pump circuit 200, and the LPF 300 form the phase locked circuit 350 for locking the phases of the first step of the unit delay circuits except the first two steps of the unit delay circuits, the unit delay circuits 501, 502 that are dummies (See description of FIG. 18), namely the unit delay circuit 503 and the last step thereof, the unit delay circuit 516 so that the both phases are in phase and the phases of the output clock signals of the unit delay circuits from the first step thereof 503 to the last step thereof 516 are delayed by T/(2n).

As described above, the unit delay circuit 503 is composed of the first step of the inverter circuit structure including the inverters INV1, INV2, and MOS transistors Q1, Q2 for controlling the amount of delay and the second step of the inverter circuit structure including the inverters INV3, INV4, and MOS transistors Q3, Q4 combined in series. The structures and the operations of other delay circuits are substantially the same as shown in FIG. 2.

Figure 3:
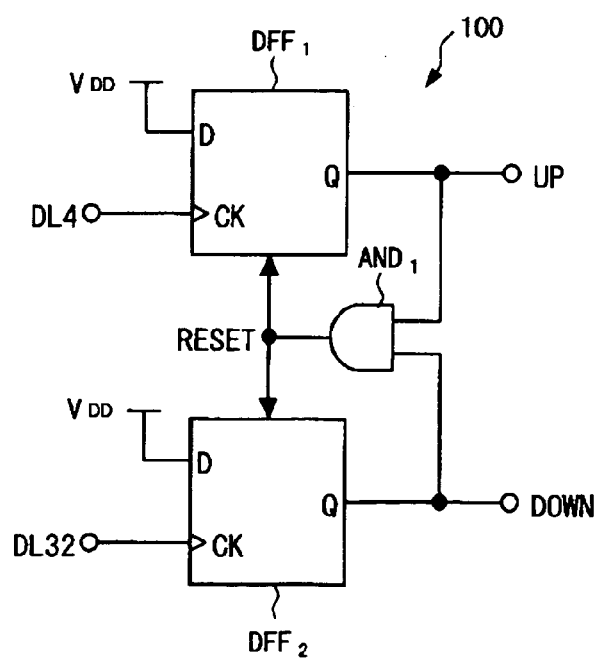
FIG. 3 is a circuit diagram showing a configuration example of a phase comparator circuit.

The phase comparator circuit 100 is, as shown in FIG. 3, composed of a D-type flip flop DFF1 that receives a clock signal DL4 on the CK terminal and the direct current power source voltage VDD on the D terminal and outputs an up-signal (hereinafter referred to as UP signal) from the Q terminal, a D-type flip flop DFF2 that receives a clock signal DL32 on the CK terminal and the direct current power source voltage VDD on the D terminal and outputs a down-signal (hereinafter referred to as DOWN signal) from the Q terminal, and an AND circuit AND1 that makes the logical product of the UP signal and the DOWN signal to output a reset signal (hereinafter referred to as RESET signal) for the D-type flip flops DFF1 and DFF2.

Figure 4:
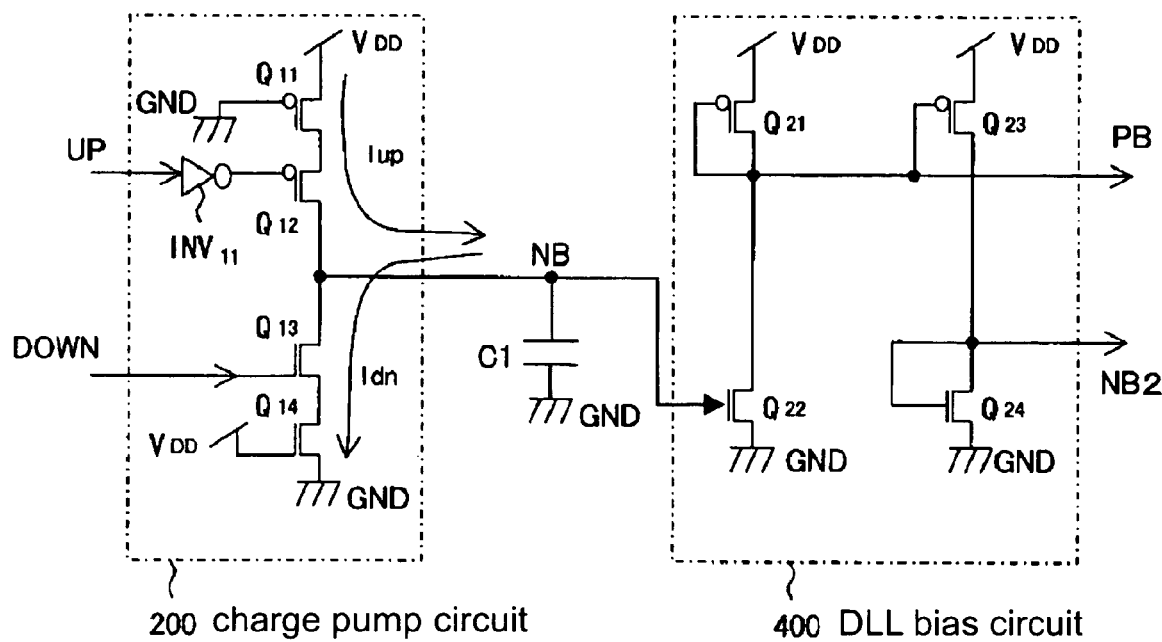
FIG. 4 is a circuit diagram showing a configuration example of a charge pump circuit, a LPF circuit, and a DLL bias circuit.

The charge pump circuit 200, the LPF 300, and the DLL bias circuit 400 are configured as shown in FIG. 4.

The charge pump circuit 200 has a configuration in which PMOS transistors Q11, Q12 and NMOS transistors Q13, Q14 are connected in series between the direct current power source voltage VDD and the reference potential point GND (the potential of VSS), wherein the source of the PMOS transistor Q11 is supplied with the power source voltage VDD, the gate of the PMOS transistor Q11 is connected to the reference potential point, the gate of the PMOS transistor Q12 is supplied with a signal made by inverting the UP signal output from the phase comparator circuit 100 by an inverter INV11, the gate of the NMOS transistor Q13 is supplied with the DOWN signal output from the phase comparator circuit 100, the source of the NMOS transistor Q14 is connected to the reference potential point GND, and a capacitor C1 is connected between the reference potential point GND and the common connection point of the PMOS transistor Q12 and the NMOS transistor Q13. When the UP signal is output from the phase comparator circuit 100, both of the PMOS transistors Q11 and Q12 are turned on to make the charge current Iup flow into the capacitor C1 in accordance with the power source voltage VDD to increase the charge. In contrast, when the DOWN signal is output from the phase comparator circuit 100, both of the NMOS transistors Q13, Q14 are turned on to make the discharge current Idn flow out of the capacitor C1 to the reference potential point GND to discharge the capacitor C1. When the clock signals DL4, DL32 input to the phase comparator circuit 100 are in phase, the D-type flip flops DFF1, DFF2 are reset to keep the voltage NB of the capacitor C1 in a constant voltage without any charge or discharge to the capacitor.

The DLL bias circuit 400 generates two types of bias voltages PB and NB2 to be fed to the gates of the transistors Q1, Q2, Q3, and Q4 for controlling the amount of delay of the unit delay circuit (See FIG. 2) based on the voltage NB of the capacitor forming the LPF. The DLL bias circuit 400 composed of a series circuit structure in which a PMOS transistor Q21 and an NMOS transistor Q22 are connected in series between the direct current power source voltage VDD and the reference potential point GND, the gate and the drain of the PMOS transistor Q21 are commonly connected, the source of the PMOS transistor Q21 is connected to the power source voltage VDD, the source of the NMOS transistor Q22 is connected to the reference potential point GND, the drains of the PMOS transistor Q21 and the NMOS transistor Q22 are commonly connected, and the gate of the NMOS transistor Q22 is supplied with the voltage NB of the capacitor C1, and a series circuit structure in which a PMOS transistor Q23 and an NMOS transistor Q24 are connected in series between the direct current power source voltage VDD and the reference potential point GND, the gate of the PMOS transistor Q23 and the drain of the NMOS transistor Q21 are commonly connected, the source of the PMOS transistor Q23 is connected to the power source voltage VDD, the gate and the drain of the NMOS transistor Q24 are commonly connected, the source of the NMOS transistor Q24 is connected to the reference potential point GND, the bias voltage PB for controlling the amount of delay is output from the common connection point of the drain of the PMOS transistor Q21 and the gate of the PMOS transistor Q23, and the bias voltage NB2 for controlling the amount of delay is output from the common drain of the transistors Q23 and Q24.

The operations of the phase comparator circuit 100 through the charge pump circuit 200, and the LPF 300 are substantially the same as those in a typical Phase Locked Loop (PLL) or DLL. The rising edge of the clock signal DL4 is the reference in comparing the phases.

If the rising edge of the clock signal DL32 comes earlier than that of the clock signal DL4, the DOWN pulse corresponding to the phase difference is output. In a period in which the DOWN pulse is active corresponding to the width of the DOWN pulse, the DOWN current (Idn) of the charge pump circuit 200 flows to discharge the capacitor C1 of the LPF 300. Then, as a result, the DLL bias voltage NB drops to increase the amount of delay in the unit delay circuit making the edge of the clock signal DL32 be delayed.

In contrast, if the rising edge of the clock signal DL32 is later than that of the clock signal DL4, the UP pulse corresponding to the phase difference is output. In a period in which the UP pulse is active corresponding to the width of the UP pulse, the UP current (Iup) of the charge pump circuit 200 flows to charge the capacitor C1 of the LPF 300. As a result, the DLL bias voltage NB rises to decrease the amount of delay in the unit delay circuit making the edge of the clock signal DL32 be brought forward.

The edge of the clock signal DL32 is repeatedly delayed and brought forward, and gradually moves to a locked state.

The clock delay correction circuit 800 controls the delay (corrects the delay) of the clock signal CK input thereto. The clock delay bias circuit 700 generates a control signal NB3 input to the clock delay correction circuit 800 based on the control voltage NB supplied from the LPF circuit 300.

Figure 5:
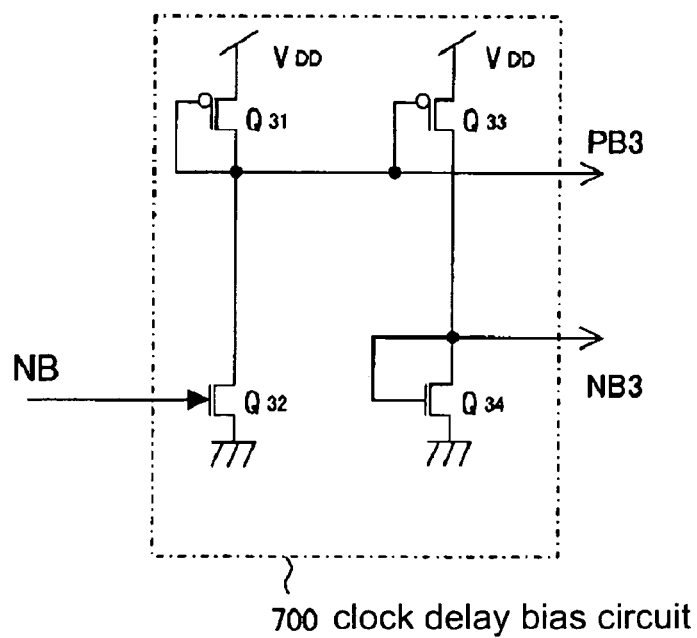
FIG. 5 is a circuit diagram showing an example of a clock delay bias circuit.

FIG. 5 shows an example of a configuration of the clock delay bias circuit 700 as a delay amount control circuit. The clock delay bias circuit 700 generates, based on the voltage of the capacitor C1 forming the LPF circuit, two kinds of bias voltages PB3 and NB3 as control signals for controlling the delay correction amount in the clock delay correction circuit 800. The clock delay bias circuit 700 composed of a series circuit structure in which a PMOS transistor Q31 and an NMOS transistor Q32 are connected in series between the direct current power source voltage VDD and the reference potential point GND, the gate and the drain of the PMOS transistor Q31 are commonly connected, the source of the PMOS transistor Q31 is connected to the power source voltage VDD, the source of the NMOS transistor Q32 is connected to the reference potential point GND, the drains of the PMOS transistor Q31 and the NMOS transistor Q32 are commonly connected, and the gate of the NMOS transistor Q32 is supplied with the voltage NB of the capacitor C1, and a series circuit structure in which a PMOS transistor Q33 and an NMOS transistor Q34 are connected in series between the direct current power source voltage VDD and the reference potential point GND, the gate of the PMOS transistor Q33 and the drain of the NMOS transistor Q31 are commonly connected, the source of the PMOS transistor Q33 is connected to the power source voltage VDD, the gate and the drain of the NMOS transistor Q34 are commonly connected, the source of the NMOS transistor Q34 is connected to the reference potential point GND, the bias voltage PB3 for controlling the amount of delay is output from the common connection point of the drain of the PMOS transistor Q31 and the gate of the PMOS transistor Q33, and the bias voltage NB3 for controlling the amount of delay is output from the common drain of the transistors Q33 and Q34.

Figure 6:
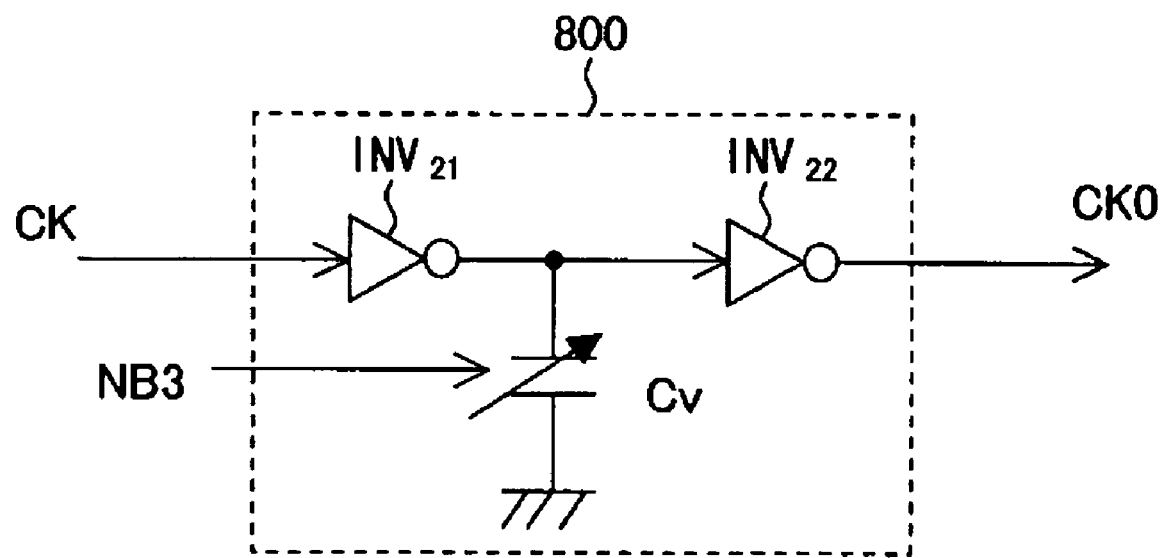
FIG. 6 is a circuit diagram showing a configuration example (a varicap type) of a clock delay correction circuit.

FIG. 6 shows an example of a configuration of the clock delay correction circuit 800 as a clock correction circuit, in which the input clock signal CK is corrected in the delay by passing through the inverters INV21, INV22 serially connected and further through a variable capacitor (hereinafter referred to as a varicap) Cv connected between the reference potential point GND and the connection point of the inverters INV21, INV22, and output to the delay circuit 500 as an input clock signal CK0. The bias voltage NB3 for controlling the delay correction amount is supplied as a control signal to the varicap Cv from the clock delay bias circuit 700.

FIG. 7 shows charts for explaining the varicap characteristic in accordance with the frequency alteration of the DLL input clock in the DLL circuit 10.

Figure 7A:
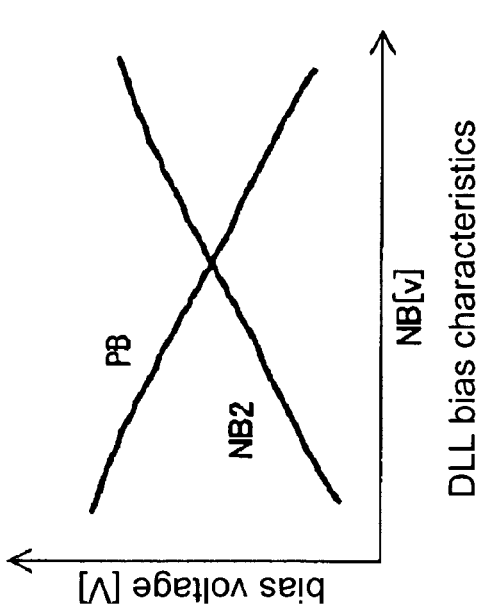
FIGS. 7(A) through 7(D) are charts for explaining the varicap characteristics with respect to a frequency alteration of a DLL input clock signal CK in a DLL circuit.

FIG. 7(A) shows the alteration of the output voltage NB of the LPF circuit 300 in accordance with the frequency alteration of the input clock signal CK in FIG. 6. As the frequency of the input clock signal increases, the bias voltage NB of the LPF circuit rises.

Figure 7B:
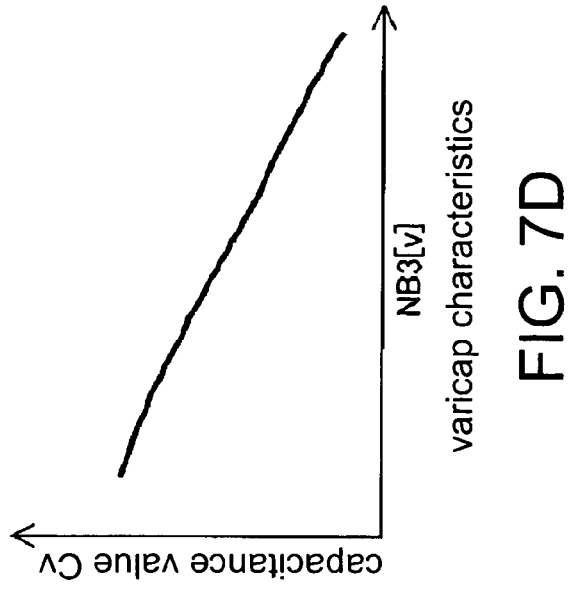

FIG. 7(B) shows the alteration of the DLL bias voltages PB, NB2 of the DLL bias circuit 400 in accordance with the alteration of the bias voltage NB. When the bias voltage NB according to the LPF circuit rises, the PMOS bias signal PB and the NMOS bias signal NB2 change in conjunction with each other so that the PMOS bias signal PB drops while the NMOS bias signal NB2 rises.

Figure 7C:
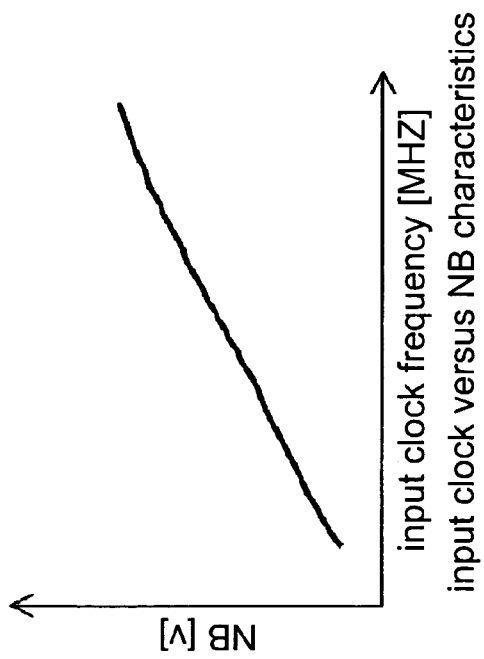

FIG. 7(C) shows the alteration of the clock bias voltages PB3, NB3 in the clock delay bias circuit 700 in accordance with the alteration of the input bias voltage NB according to the LPF circuit. As the frequency of the input clock CK increases, the bias voltage NB according to the LPF circuit rises as shown in FIG. 7(A), as a result, the bias signals NB3 and PB3 for the clock delay correction circuit change in conjunction with each other so that the bias signal NB3 rises while the bias signal PB3 drops.

Figure 7D:
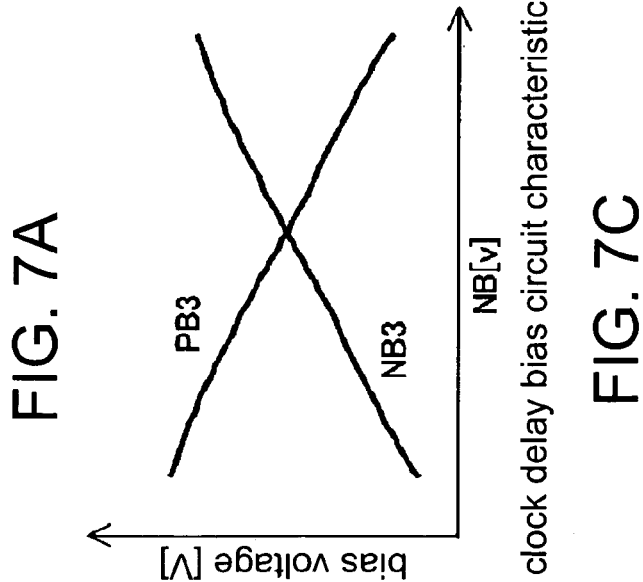

FIG. 7(D) shows the alteration of the capacitance of the varicap Cv forming the clock delay correction circuit 800 shown in FIG. 6 in accordance with the alteration of the bias signal NB3 for the clock delay correction circuit. When the clock delay bias voltage NB3 rises, the varicap Cv forming the clock delay correction circuit 800 is controlled to have less capacity to reduce the clock delay amount in the clock delay correction circuit 800. Accordingly, the input clock signal CK0 to the delay circuit 500 is brought forward. Therefore, an original characteristic of the DLL circuit, "the DLL output clock is delayed when the frequency of the DLL input clock signal CK0 increases," can be canceled.

Figure 8:
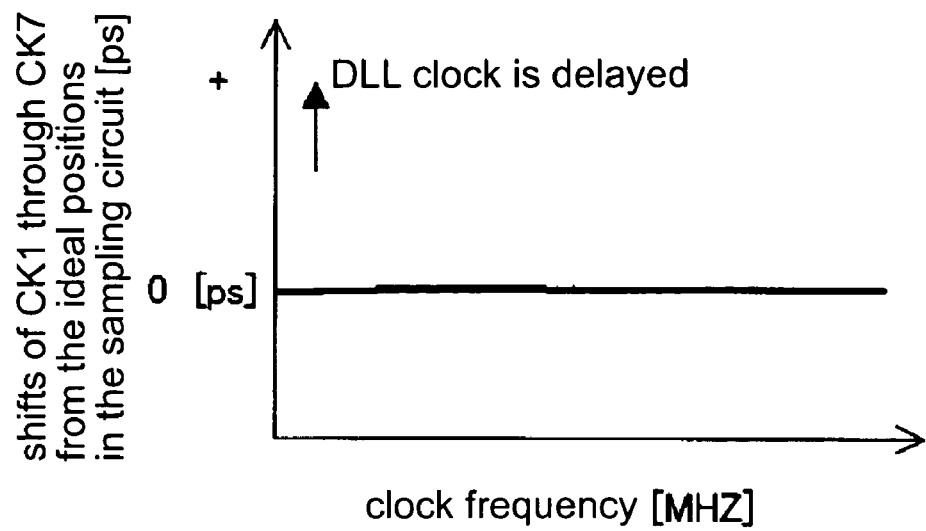
FIG. 8 is a chart showing shifts in sampling clock signals CK1 through CK7 output to a sampling circuit 20 from the ideal positions thereof in accordance with a frequency alteration of a DLL input clock CK.

FIG. 8 shows shifts in the sampling clock signals CK1 through CK7 output to the sampling circuit 20 from the ideal positions thereof in accordance with the frequency alteration of the DLL input clock CK. Since a base point of DLL is kept while the clock frequency of the input clock signal CK changes, the clock signals CK1 through CK7 do not shift from the ideal positions in the sampling circuit. Note that the base point of the DLL denotes a time point corresponding to an imaginary start position of the DLL:

"Time of DL4 (=TDL4)"-"1/7 of the DLL input clock period (=T/7)"

Figure 19:
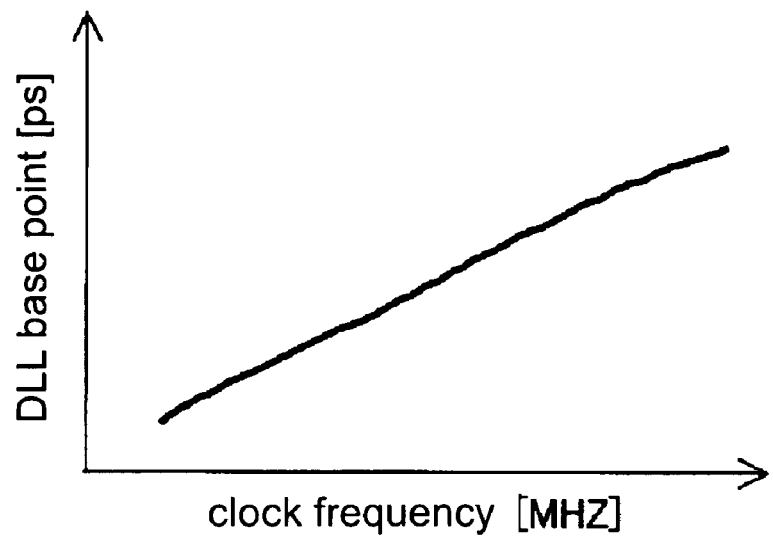
FIG. 19 is a graph chart showing characteristics of a DLL input clock frequency with respect to a DLL base time point in a DLL circuit (without a clock delay correction circuit and a clock delay bias circuit).

(See descriptions regarding FIG. 19).

Figure 9:
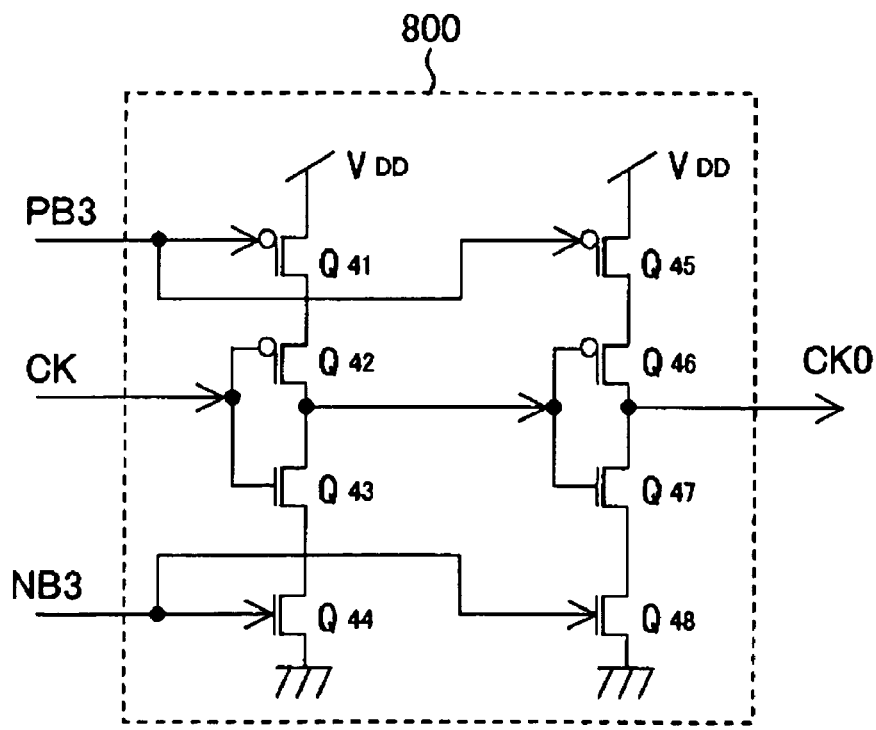
FIG. 9 is a circuit diagram showing another configuration example (a current control type) of a clock delay correction circuit.

FIG. 9 shows an example of another configuration of the clock delay correction circuit 800 in which the input clock signal CK is corrected in the delay by passing through the current control type clock delay correction circuit 800 to output to the delay circuit 500 as the delay corrected clock signal CK0.

Namely, the clock delay correction circuit 800 is composed of a series circuit structure in which PMOS transistors Q41, Q42 and NMOS transistors Q43, Q44 are connected in series between the power source voltage VDD and the reference potential point GND, the input clock signal CK is input to the commonly connected gates of the PMOS transistor Q42 and the NMOS transistor Q43, the bias voltage PB3 (See FIG. 5) output from the clock delay bias circuit 700 is input to the gate of the PMOS transistor Q41 provided for controlling, the bias voltage NB3 output from the clock delay bias circuit 700 is input to the gate of the NMOS transistor Q44 provided for controlling, and a signal is output from the commonly connected drains of the transistors Q42 and Q43 as a first clock signal, and a series circuit structure in which PMOS transistors Q45, Q46 and NMOS transistors Q47, Q48 are connected in series between the power source voltage VDD and the reference potential point GND, the first clock signal is input to the commonly connected gates of the PMOS transistor Q46 and the NMOS transistor Q47, the bias voltage PB3 output from the clock delay bias circuit 700 is input to the gate of the PMOS transistor Q45 provided for controlling, the bias voltage NB3 output from the clock delay bias circuit 700 is input to the gate of the NMOS transistor Q48 provided for controlling, and a signal is output from the commonly connected drains of the transistors Q46 and Q47 as the clock signal CK0.

Figure 10:
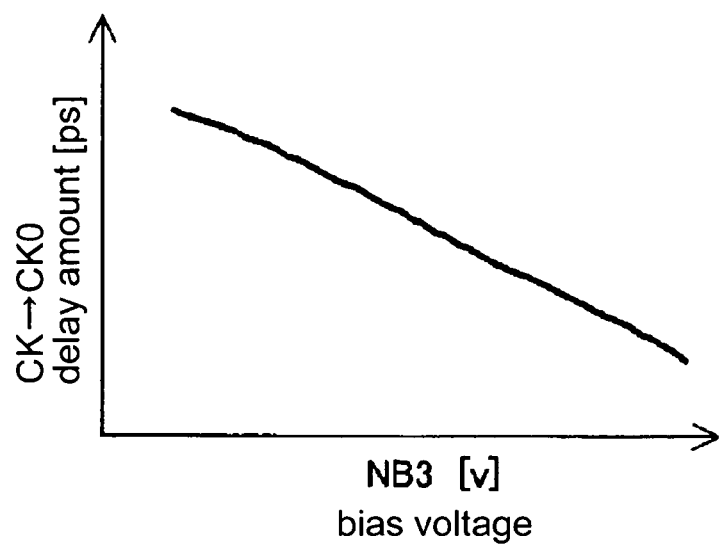
FIG. 10 is a chart showing an alteration characteristic of the amount of delay between an input clock signal CK and a clock signal CK0 that is corrected in delay and then output therefrom with respect to a bias voltage MB3 in a circuit shown in FIG. 9.

FIG. 10 shows an alteration characteristic of the amount of delay (hereinafter abbreviated as CK→CK0 delay amount) of the clock signal CK0 with a corrected delay from the input clock signal CK with respect to the bias voltage MB3 in the circuit shown in FIG. 9.

In the clock delay correction circuit 800 of FIG. 9, as the frequency of the input clock signal CK increases, the bias voltage NB according to LPF circuit also rises. Assuming that the characteristics of the bias voltages NB3, PB3 with respect to the bias voltage NB are as shown in FIGS. 7(A) and 7(C), the bias voltages NB3 and PB3 change in conjunction with each other. Accordingly, when the frequency of the input clock signal CK increases, the CK→CK0 delay amount decreases.

Therefore, as is the case with the clock delay correction circuit shown in FIG. 6, since a base point of the DLL is kept while the clock frequency of the input clock signal CK changes, the clock signals CK1 through CK7 input to the sampling circuit 20 do not shift from the ideal positions.

Figure 11:
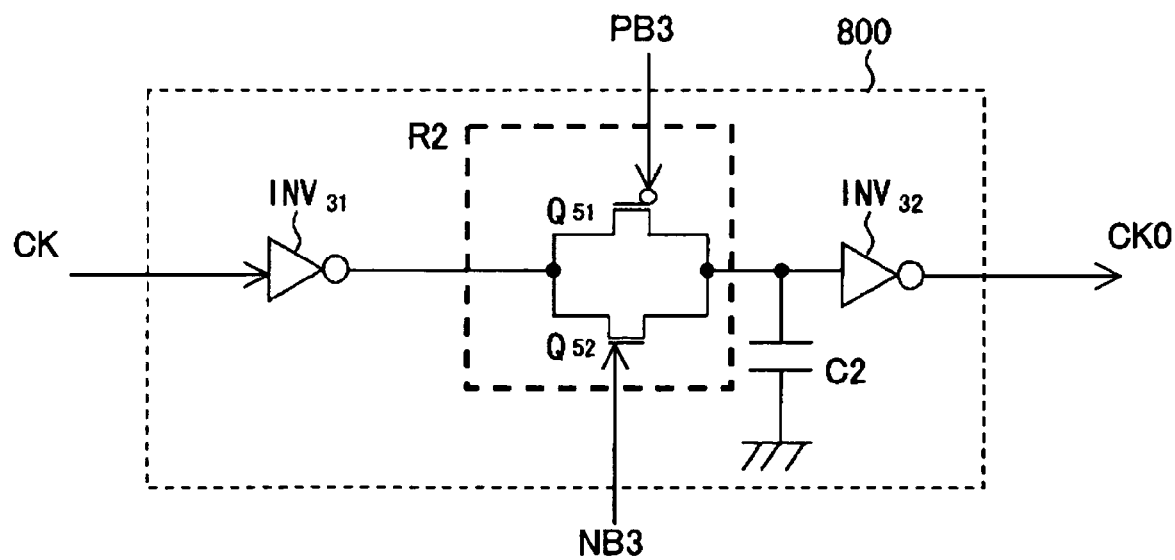
FIG. 11 is a circuit diagram showing another configuration example (a variable resistance control type) of a clock delay correction circuit.

FIG. 11 shows another configuration sample of the clock delay correction circuit 800 in which the input clock signal CK is corrected in the delay by passing through the time constant circuit composed of a variable resistor for controlling the clock delay amount and a capacitor to output to the delay circuit 500 as the delay corrected clock signal CK0.

Namely, in the clock delay correction circuit 800, the input clock signal CK is processed by passing through an inverter INV31, further through the time constant circuit composed of a variable resistor R2 and a capacitor C2, and then through an inverter INV32 to be output as the clock signal CK0. The variable resistor R2 is composed of a PMOS transistor Q51 and an NMOS transistor Q52 connected in parallel by respectively connecting the source and the drain of the transistor Q51 with the source and the drain of the transistor Q52 wherein the bias voltages PB3 and NB3 are respectively fed to the gates of the transistors Q51 and Q52 to alter the conductive resistances thereof in accordance with the levels of the bias voltages.

Figure 12A:
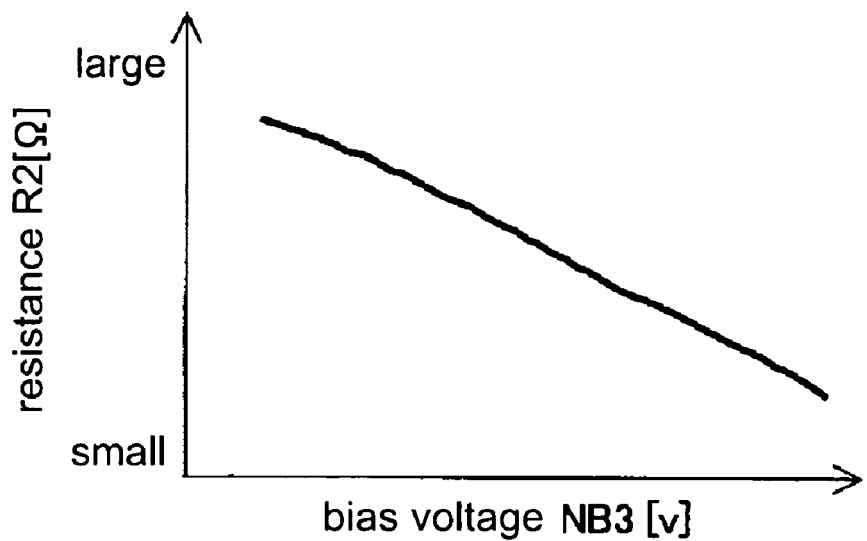
FIGS. 12(A) and 12(B) are charts showing characteristics of a clock delay correction circuit shown in FIG. 11.
Figure 12B:
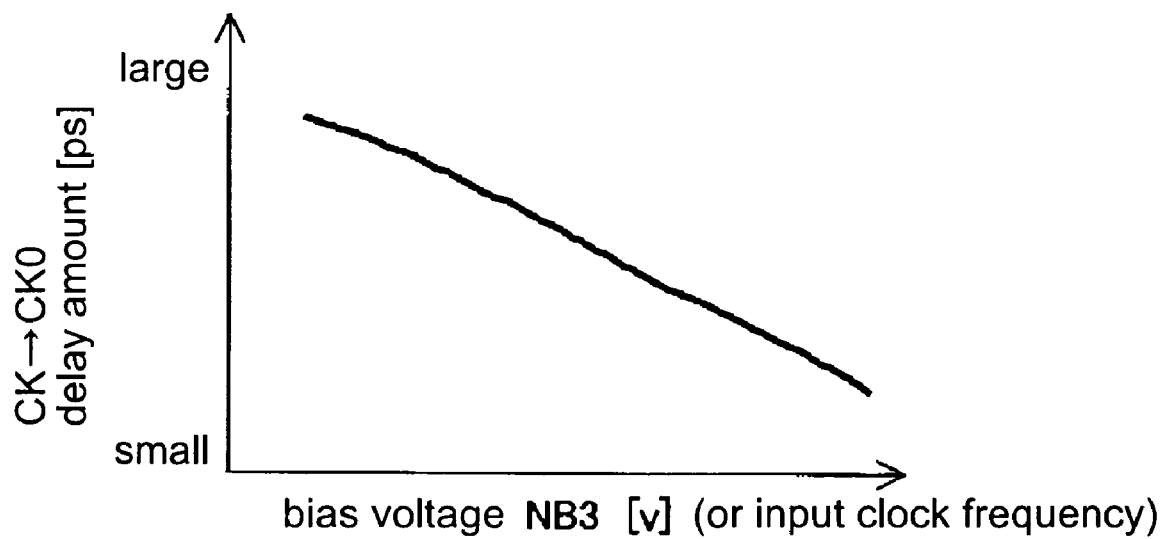

FIG. 12(A) shows an alteration characteristic of the resistance of the variable resistor R2 with respect to the alteration of the bias voltage NB3, and FIG. 12(B) shows the delay amount (hereinafter abbreviated as CK→CK0 delay amount) of the clock signal CK0 with a corrected delay from the input clock signal CK is corrected in the delay in accordance with the alteration of the bias voltage NB3 (or the frequency of the input clock CK).

In the clock delay correction circuit 800 shown in FIG. 11, when the frequency of the input clock signal CK increases, the bias voltage NB according to the LPF circuit also rises. Assuming that the characteristics of the bias voltages NB3, PB3 with respect to the bias voltage NB are as shown in FIGS. 7(A), 7(C), the bias voltages NB3, PB3 change in conjunction with each other. Therefore, when the frequency of the input clock signal CK increases (in other words, the bias voltage PB3 drops), the resistance of the variable resistor R2 decreases. As a result, the CK→CK0 delay amount decreases inversely proportional to the value of R2*C2 (* denotes multiplication).

Therefore, as is the case with the clock delay correction circuit shown in FIG. 6, since a base point of DLL is kept while the clock frequency of the input clock signal CK changes, the clock signals CK1 through CK7 input to the sampling circuit 20 do not shift from the ideal positions.

FIG. 13(A) shows another configuration example of the clock delay correction circuit 800 in which a plurality of (in the drawing, two) varicaps as in FIG. 6 are provided to enable to change the varicap size allowing to select the strength of the clock delay correction from a plurality of levels (e.g., three levels).

Namely, in the clock delay correction circuit 800 shown in FIG. 13(A), the input signal CK is processed by passing through inverters INV41, INV42, INV43, and INV44 and then output to the delay circuit 500 as the input clock CK0, wherein the a varicap Cva is connected between the reference potential point GND and the connection point of the inverters INV41, INV42 and a varicap Cvb is connected between the reference potential point GND and the connection point of the inverters INV43, INV44.

A bias voltage NB3A generated by a circuit shown in FIG. 13(C) in accordance with the bias voltage NB3 for controlling the delay correction amount output from the clock delay bias circuit 700 is supplied to the varicap Cva as a control signal. A bias voltage NB3B generated by the circuit shown in FIG. 13(C) in accordance with the bias voltage NB3 for controlling the delay correction amount output from the clock delay bias circuit 700 is supplied to the varicap Cvb as a control signal. In the circuit shown in FIG. 13(C), S0, S1 denote digital setting pins and the digital value set by them, S0X, S1X can be obtained by inverting the set values of S0, S1 by respective inverters in the inverter circuit shown in FIG. 13(B).

The circuit shown in FIG. 13(C) is composed of two transmission gates connected in parallel, wherein a first transmission gate is composed of a PMOS transistor Q61 and an NMOS transistor Q62, a second transmission gate is composed of a PMOS transistor Q63 and an NMOS transistor Q64, and both of the transistors are turned on when both of the gate inputs S0, S1 are in a "1" state while both of the transistors are turned off when both of the gate inputs S0, S1 are in a "0" state.

FIG. 14 shows a relationship between the settings of the setting pins S0, S1 and the capacities Cva, Cvb, in the clock delay correction circuit 800 shown in FIG. 13.

Therefore, the size of the variable capacitance can be selected by the digital setting pins. If the value of the variable capacitances are as follows, the total capacitance is as shown in FIG. 14. Since the varicap size can be altered by changing the settings of the pins S0, S1, the strength of the clock correction amount can be altered to one of a plurality of levels (3 or 4 levels in the drawings).

Figure 15:
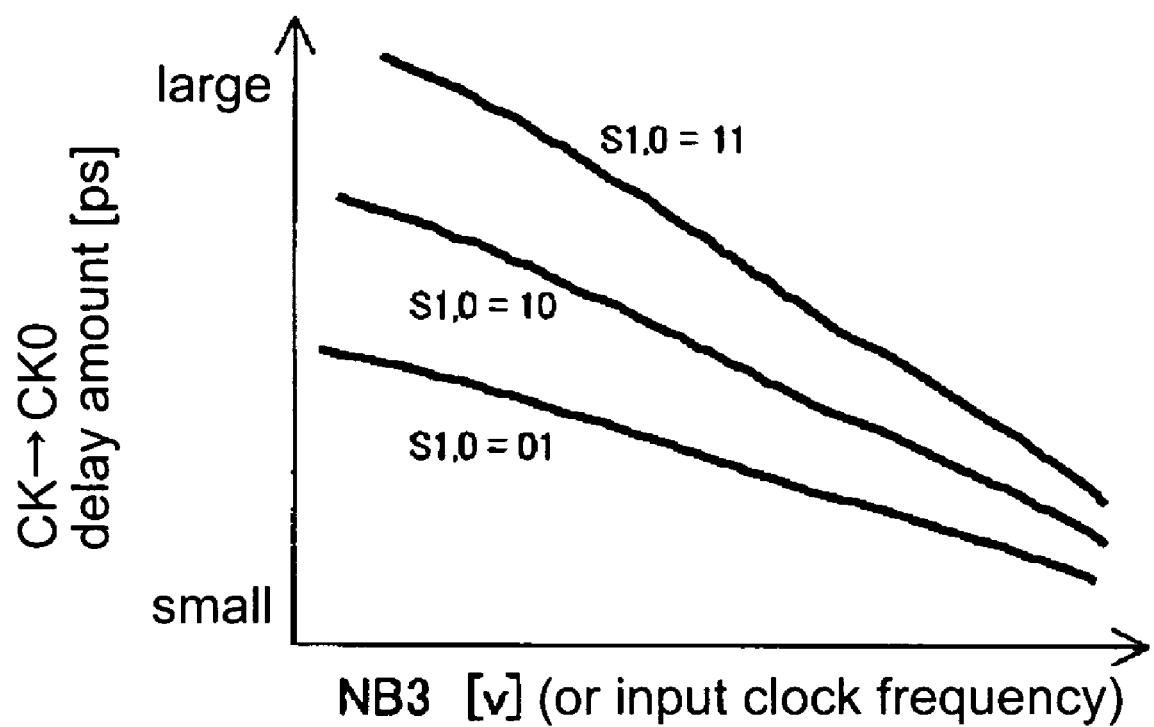
FIG. 15 is a graph chart showing a relationship between a bias voltage NB3 and a CK→CK0 delay amount in accordance with various settings of setting pins S0, S1 in a clock delay correction circuit shown in FIG. 13.

FIG. 15 shows a chart of a relationship between the bias voltage NB3 and the CK→CK0 delay amount in accordance with various settings of the setting pins S0, S1 in the clock delay correction circuit 800. There are three correction curves similar to the curve shown in FIG. 12(B), which shows that the clock delay correction amount can be switched to one of three strength levels by the settings of the setting pins S0, S1.

As above, FIG. 1 and structures and functions of each section shown in FIG. 1 are described. Hereinafter, timing relationships of the multi-phase (seven phases in the drawings) clock signals generated by the delay circuit 500 when the delay is corrected by the clock delay correction circuit 800, the sampling clock signals CK1 through CK7 generated by the sampling clock generating circuit 600 based on the multi-phase clock signals, and the sampling data sampled by the sampling clock signals are described.

Since the clock signals DL4 and DL32 are input to the phase comparator circuit 100, the output signal NB of the charge pump circuit 200 is defined so that the phase locked loop of the DLL circuit 10 is locked when the rising edges of the clock signals DL4 and DL32 are aligned with each other.

Since the DLL bias signals PB, NB2 generated from the signal NB by the DLL bias circuit 400 are commonly fed to all the unit delay circuits in the delay circuit 500 in the DLL circuit, the clock signals DL6, DL8, DL10, . . . , DL28, DL30 disposed between the clock signals DL4 and DL32 have constant intervals.

By inputting these clock signals to the sampling clock generating circuit 600, the sampling clock signals CK1 through CK7 can be generated by a simple logic circuit based on the clock signals DL4 through DL32.

Assuming that the period of the input clock signal CK is T, the level of CK1 becomes high with a delay of T/14 from the input clock. The sampling clock signals CK1 through CK7 are uniform seven-phase clock signals having equal intervals of T/7.

More generally, a high level duration of a sampling clock signal CKm that is the mth of n-phase sampling clock signals is within the range from $(2m-1)T/2n$ to $mT/n$ (where n is a natural number, m is also a natural number and not greater than n).

The relationship between each of data N1 through N7 of the input data SD1 fed to the sampling circuit is as shown in FIG. 16. Namely, by correcting the delay of the input clock signal CK by the clock delay correction circuit 800, each of the sampling clock signals CK1 through CK7 can be aligned at the center of an effective area of the respective data N1 through N7 of the input data SD1.

Hereinafter, problems that are caused in operations of a DLL circuit that is not equipped with the clock delay correction circuit 800 and the clock delay bias circuit 700 of the present invention are described referring to FIGS. 17 through 21 to explain the advantages of the present invention.

Figure 17:
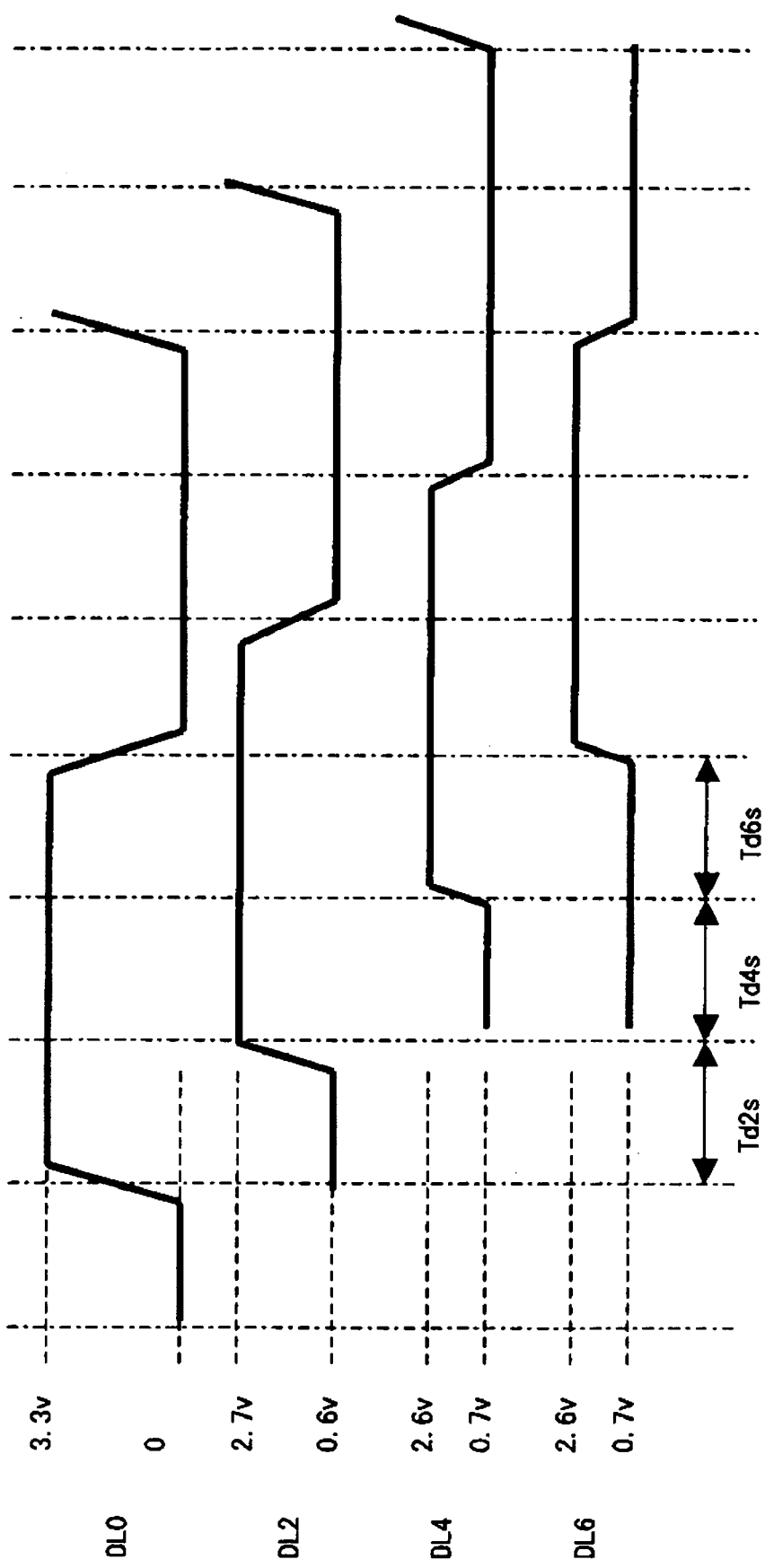
FIG. 17 is a timing chart showing the timing of input/output clock signals in the beginning unit delay circuits of a delay circuit when a low frequency input clock signal is fed to a DLL circuit (without a clock delay correction circuit and a clock delay bias circuit).

FIG. 17 shows the timing of the input/output clock signals in the beginning unit delay circuits 501 through 503 of the delay circuit 500 when a low frequency input clock signal is fed to the DLL circuit (without the clock delay correction circuit 800 and the clock delay bias circuit 700).

When the DLL input frequency is low, the LPF potential NB in the locked state is low. As a result, the current flowing in the unit delay circuit is small. The node potential PS of the unit delay circuit shown in FIG. 2 is low while the node potential NS is high. The vibration amplitude in the unit delay circuit is small.

In the example shown in FIG. 17, the vibration amplitude of DL0 is full swing (3.3V to 0V), DL2 (2.7V to 0.6V), DL4 and after constant (2.6V to 0.7V). In each unit delay circuit, the larger the input amplitude is, the smaller the delay amount becomes, relatively. Namely, the relationship therebetween is as follows:

$Td2s<<Td4s<<Td6s=Td8s\ldots =Td32s$.

Figure 18:
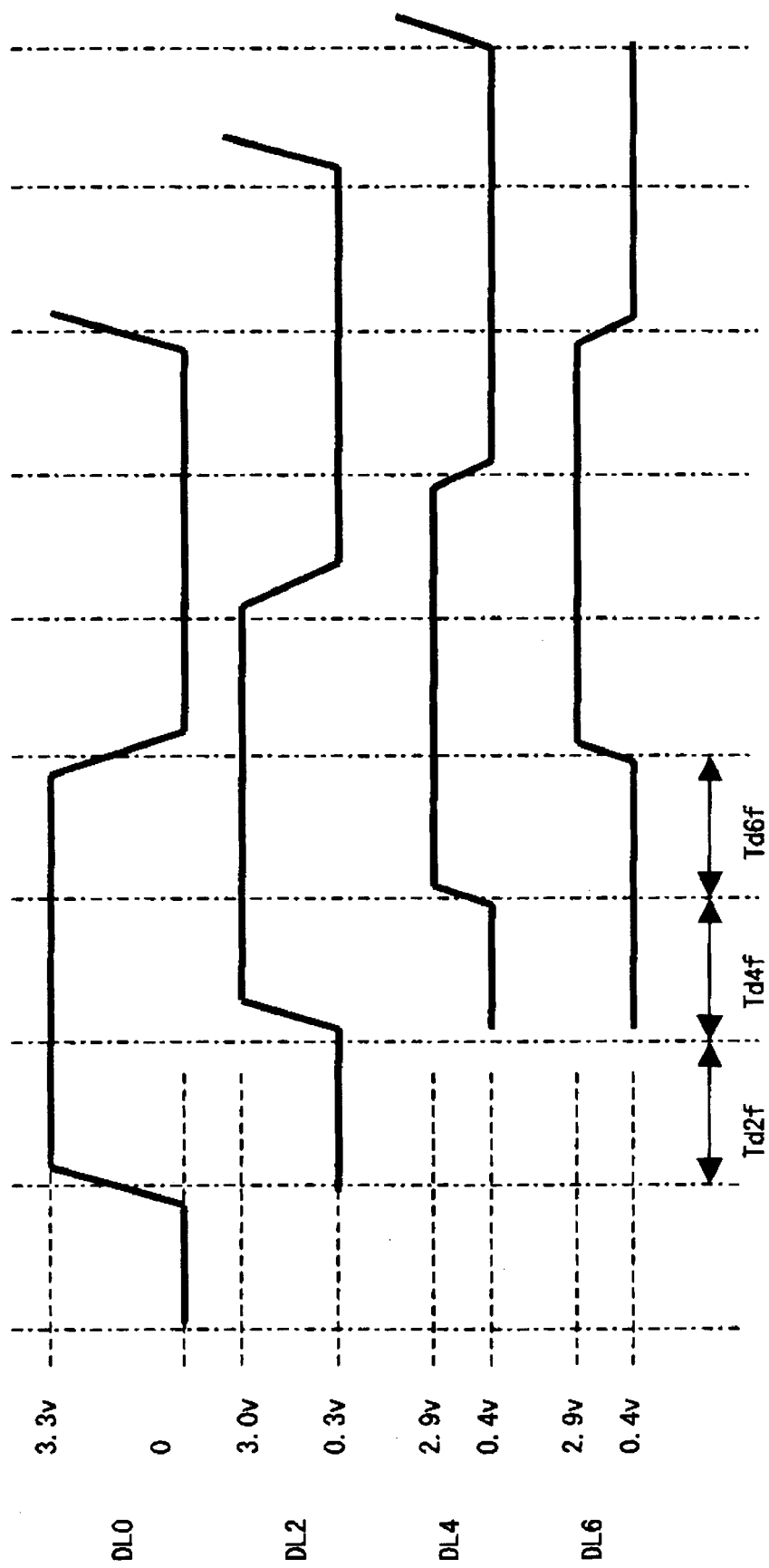
FIG. 18 is a timing chart showing the timing of input/output clock signals in the beginning unit delay circuits of a delay circuit when a high frequency input clock signal is fed to a DLL circuit (without a clock delay correction circuit and a clock delay bias circuit).

FIG. 18 shows the timing of the input/output clock signals in the beginning unit delay circuits 501 through 503 of the delay circuit 500 when a high frequency input clock signal is fed to the DLL circuit (without the clock delay correction circuit 800 and the clock delay bias circuit 700).

When the DLL input frequency is high, the LPF potential NB in the locked state is high. As a result, the current flowing in the unit delay circuit is large. The node potential PS of the unit delay circuit shown in FIG. 2 is high while the node potential NS is low. The vibration amplitude in the unit delay circuit is large.

In the example shown in FIG. 18, the vibration amplitude of DL0 is full swing (3.3V to 0V), DL2 (3.0V to −0.3V), DL4 and after constant (2.9V to 0.4V). In each unit delay circuit, the larger the input amplitude is, the smaller the delay amount becomes, relatively. Namely, the relationship therebetween is as follows:

$Td2f<<Td4f<<Td6f=Td8f\ldots =Td32f$.

In either case, the delay amounts of the beginning two unit delay circuits tend to be smaller than the average delay amount in the DLL.

In other words, when the DLL input clock frequency is low, the difference between the average delay amount of two unit delay circuits and the delay amount of the beginning two unit delay circuits is given by the following equation:

$Td(\text{slow})=(Td6s+Td8s)-(Td2s+Td4s)$.

When the DLL input clock frequency is high, the difference between the average delay amount of two unit delay circuits and the delay amount of the beginning two unit delay circuits is given by the following equation:

$Td(\text{fast})=(Td6f+Td8f)-(Td2f+Td4f)$.

In comparison of the two differences above, the following results:

$Td(\text{slow})<Td(\text{fast})$.

Therefore, it can be recognized that the DLL output clock signal is relatively advanced in the case with the low frequency DLL input clock signal in comparison to the case with the high frequency DLL input clock signal.

Conversely, it can be said that in the case the frequency of the DLL input clock signal is high, the DLL output clock signal is relatively delayed in comparison to the case with the low frequency DLL input clock signal.

In FIG. 1, the beginning two stages of unit delay circuit 501, 502 are treated as dummies, and the unit delay circuits 503 through 516 are used as fourteen (14) stages of unit delay circuits.

The beginning two stages of dummies 501, 502 are circuits inserted to gradually shift the above full-swing signal DL0 to a signal with the average vibration amplitude of the DLL unit delay circuits. At least one dummy stage is enough, and the essential operation thereof is consistent regardless of the number of dummy stages.

Further, regarding the latter fourteen (14) stages of unit delay circuits 503 through 516, N*M (M=1, 2, 3, . . . ) stages of unit delay circuits can be used as the DLL to obtain N-phase clock signals.

FIG. 19 shows characteristics of the DLL input clock frequency with respect to the DLL base time point in the DLL circuit (without the clock delay correction circuit 800 and the clock delay bias circuit 700).

Here, a concept of DLL base point is introduced. The DLL base point denotes a time point corresponding to an imaginary start position of the DLL:

"Time of *DL4* (=*TDL4*)"-"1/7 of the *DLL* input clock period (=*T*/7)".

According to the description regarding FIGS. 17 and 18, when the DLL input clock frequency rises, the DLL base point is delayed, as shown in FIG. 19.

Figure 20:
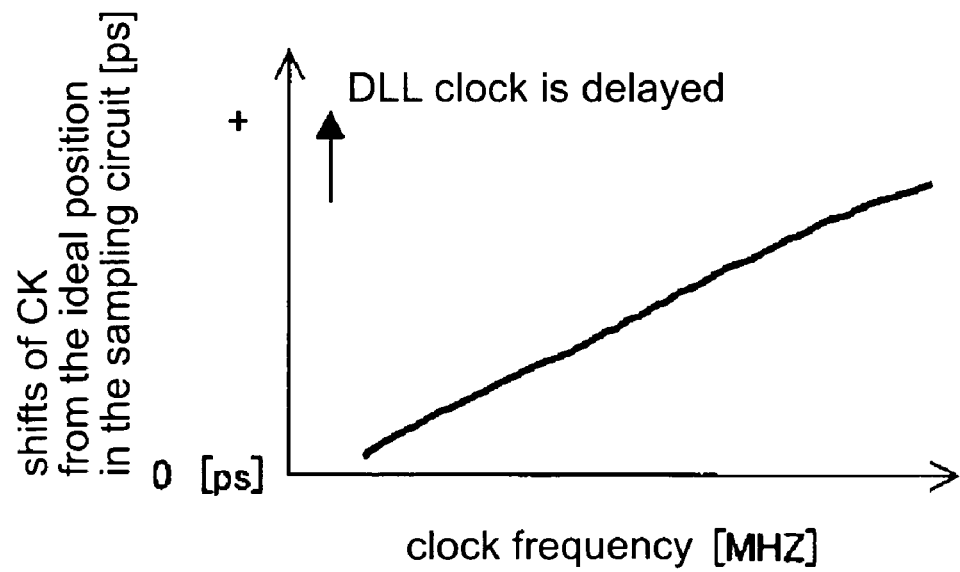
FIG. 20 is a graph chart showing shift of an input clock CK from the ideal position in a sampling circuit with respect to a DLL input clock frequency in a DLL circuit (without a clock delay correction circuit and a clock delay bias circuit).

FIG. 20 shows the shift of the input clock CK from the ideal position in the sampling circuit 20 with respect to the DLL input clock frequency in the DLL circuit (without the clock delay correction circuit 800 and the clock delay bias circuit 700). The horizontal axis represents the clock frequency, the vertical axis represents the shift.

When the DLL input clock frequency rises, the DLL base point is delayed, and accordingly, the position of the input clock signal CK in the sampling circuit 20 tends to be shifted behind its ideal point.

Figure 21:
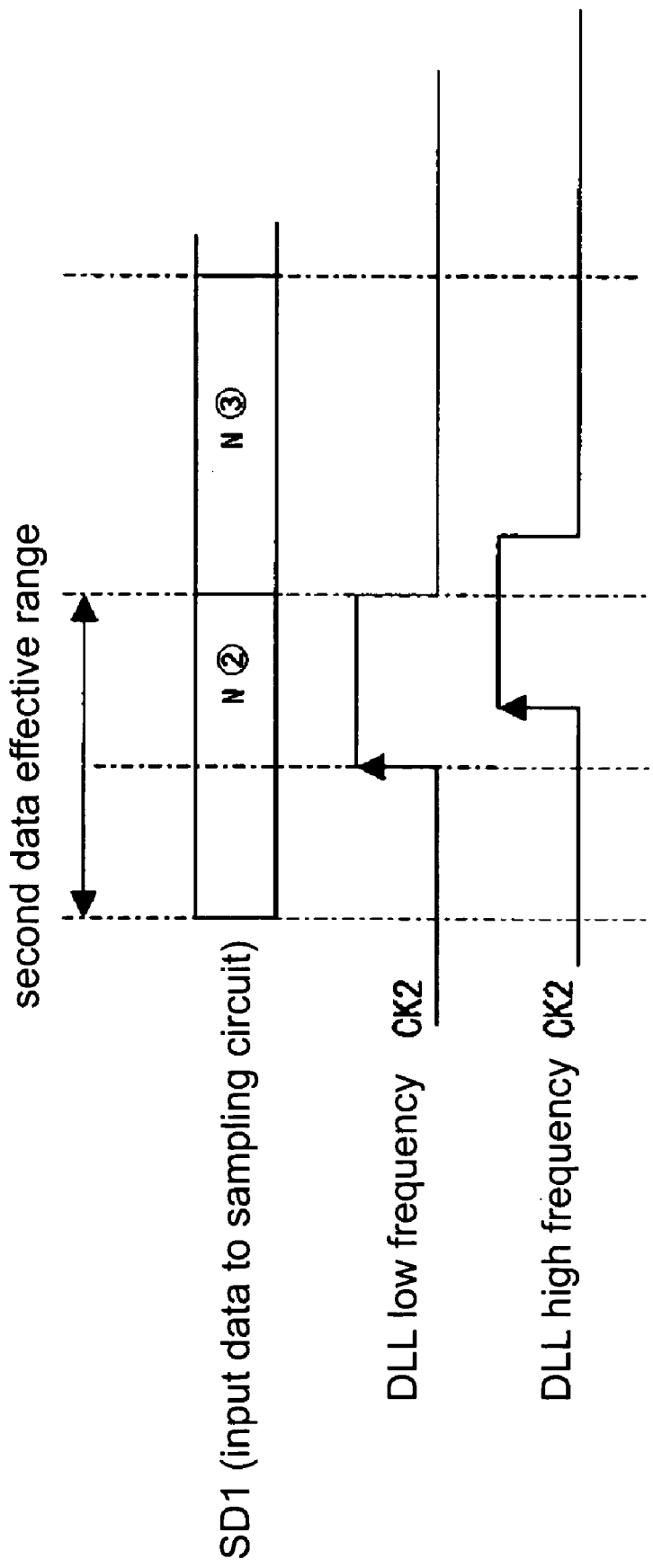
FIG. 21 is a timing chart showing the relationship between data and a DLL output clock signal in a sampling circuit 20 in a DLL circuit (without a clock delay correction circuit and a clock delay bias circuit).

FIG. 21 is a timing chart showing the relationship between the data and the DLL output clock signal in the sampling circuit 20 in the DLL circuit (without the clock delay correction circuit 800 and the clock delay bias circuit 700).

An example of the second data of the data SD1 input to the sampling circuit 20 and the clock signal CK2 for sampling the second data are illustrated.

When the DLL input clock frequency rises, the positions of all the DLL clock signals are shifted behind the ideal positions for sampling. This causes a shortage of the hold time for the data.

In contrast, according to the embodiments of the present invention described above referring to FIGS. 1 through 16, since the clock delay correction circuit 800 and the clock delay bias circuit 700 are provided on the DLL circuit to correct the delay of the input clock signals, the problem that the DLL output clock signals are delayed when the DLL input clock frequency rises can be canceled.

Therefore, if the DLL input clock frequency alters, the delays of the output clock signals from the DLL circuit with respect to the input clock signals input to the DLL circuit are maintained to stably obtain enough setup time and hold time of the input data.

Hereinafter, examples of circuits capable of employing the semiconductor devices according to the present invention explained in FIG. 1 are described referring to FIGS. 22 through 24.

Figure 22:
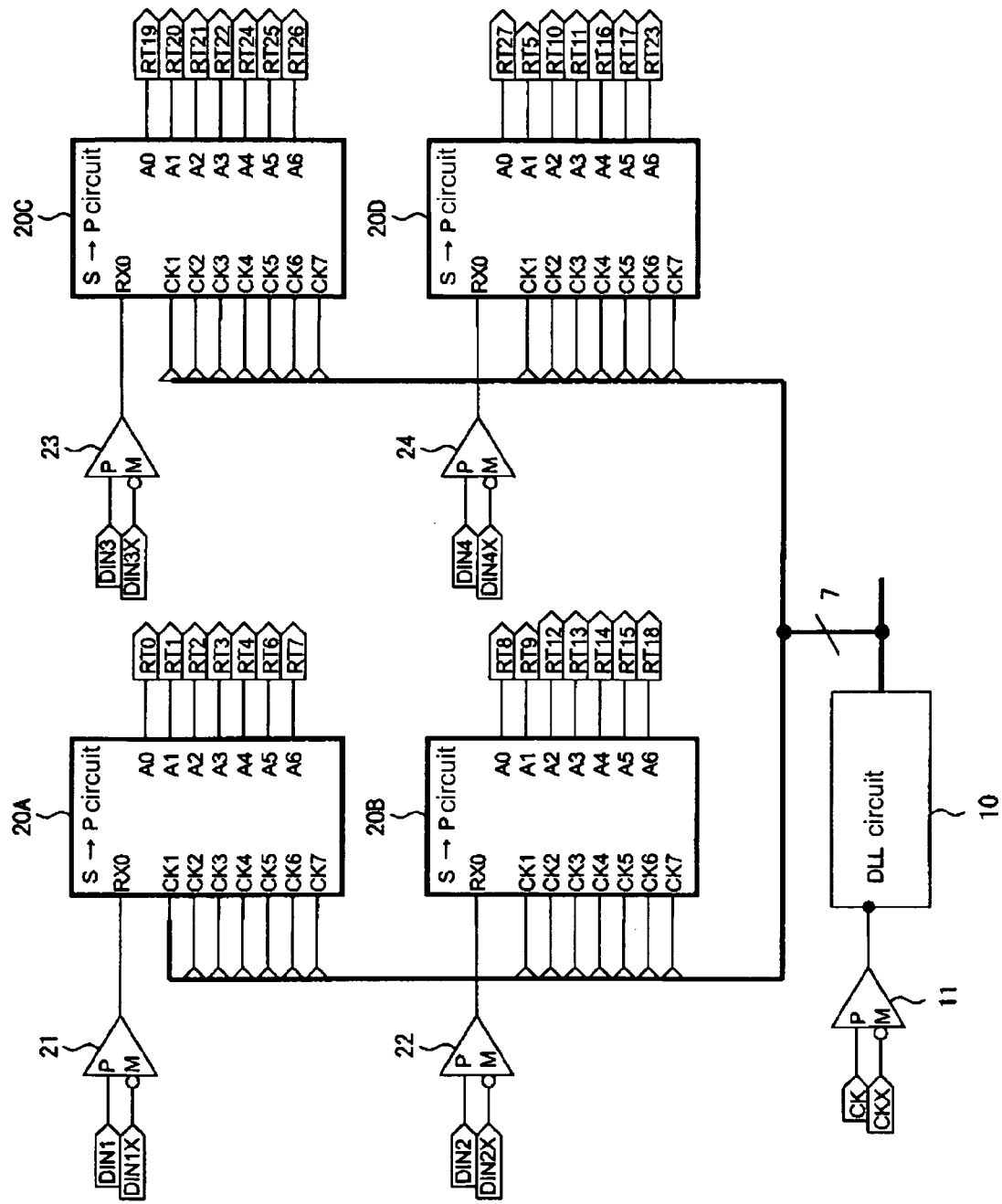
FIG. 22 is a block diagram showing an example of a receiver circuit (receiver) of a LVDS circuit according to the present invention composed of a semiconductor device shown in FIG. 1.

FIG. 22 is a block diagram showing an example of the receiver circuit (receiver) of the LVDS circuit according to the present invention composed of the semiconductor device shown in FIG. 1.

In FIG. 22, four channels of data signals (DIN1, DIN1X), (DIN2, DIN2X), (DIN3, DIN3X), and (DIN4, DIN4X) sent differentially from an output circuit (driver) of the LVDS circuit are transformed into single end signals by respective differential circuits 21, 22, 23, and 24 composed of comparators and so on, and then input to serial-parallel converter circuits (hereinafter referred to as S→P circuits) 20A, 20B, 20C, and 20D. Likewise, one channel clock signal CK sent differentially from an output circuit (driver) of the LVDS circuit is transformed into single end signal by differential circuit 11 composed of a comparator and so on, and then seven sampling clock signals CK1 through CK7 are generated for one period of the input clock signal CK by the DLL circuit 10 and input to the clock signal input terminals of the respective S→P circuits 20A, 20B, 20C, and 20D. Note that in the differential circuit, the positive signal of the differential transmission signals is input to the plus (abbreviated to P) terminal and the negative signal of the differential transmission signals is input to the minus (abbreviated to M) terminal, and the difference between both of the signals is calculated to output a single end signal.

In the S→P circuits 20A, 20B, 20C, and 20D, serial data signals of respective channels are transformed into parallel data signals (RT0, RT1, RT2, RT3, RT4, RT6, RT7), (RT8, RT9, RT12, RT13, RT14, RT15, RT18), (RT19, RT20, RT21, RT22, RT24, RT25, RT26), and (RT27, RT5, RT10, RT11, RT16, RT17, RT23) and then output.

Figure 23:
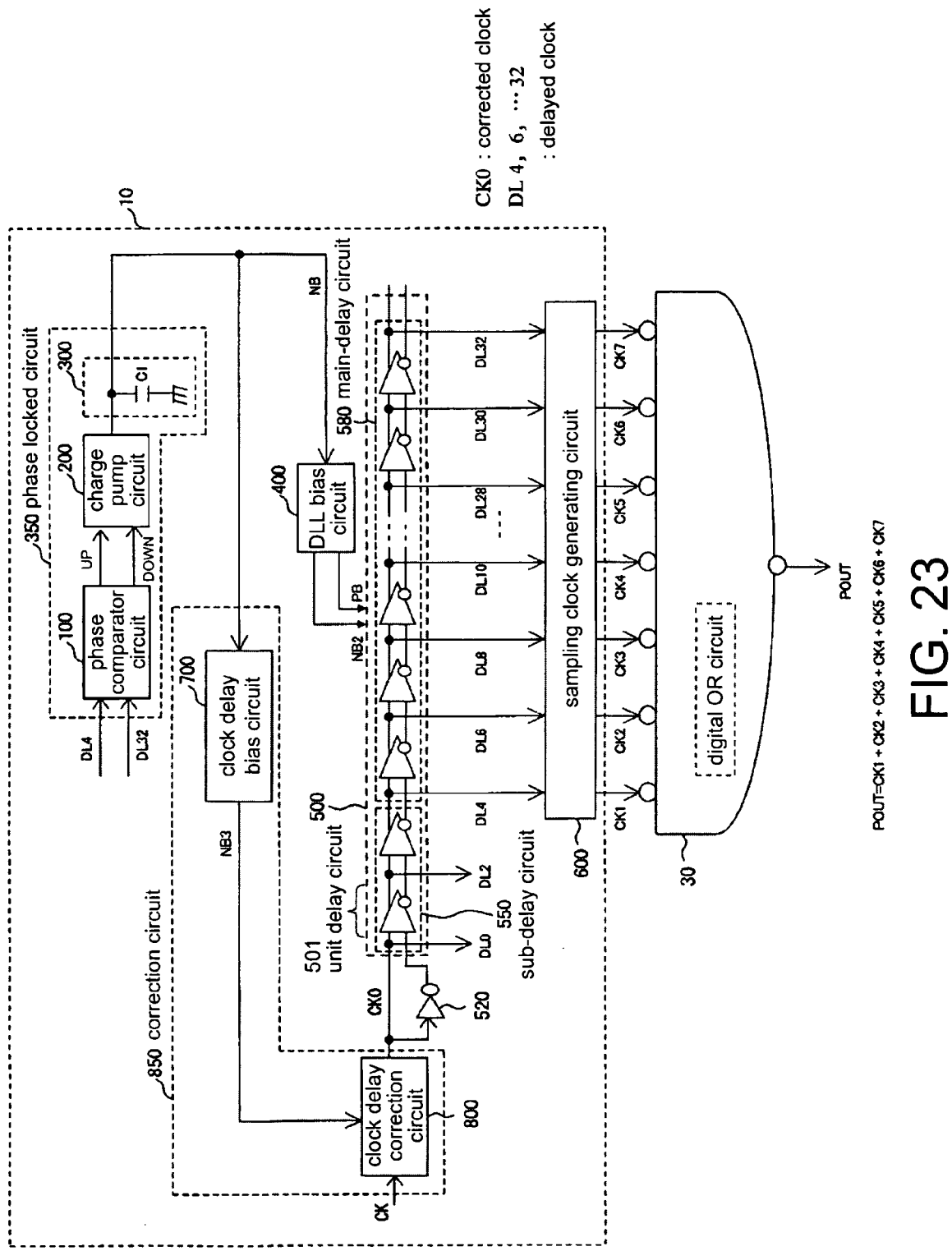
FIG. 23 is a block diagram showing an example of a frequency multiplier circuit according to the present invention, the frequency multiplier circuit being composed of a semiconductor device shown in FIG. 1.

FIG. 23 is a block diagram showing an example of a frequency multiplier circuit according to the present invention, the frequency multiplier circuit being composed of the semiconductor device shown in FIG. 1. A sevenfold circuit is described herein.

In FIG. 23, the frequency multiplier circuit can provide a clock signal, as a pulse output POUT, having a sevenfold frequency of the input clock signal CK by combining, by a digital OR circuit 30, seven phases of sampling clock signals CK1 through CK7 generated by the DLL circuit 10 shown in FIG. 1 and having pulse width of T/14 and phases shifted by T/7 from one another.

Figure 24:
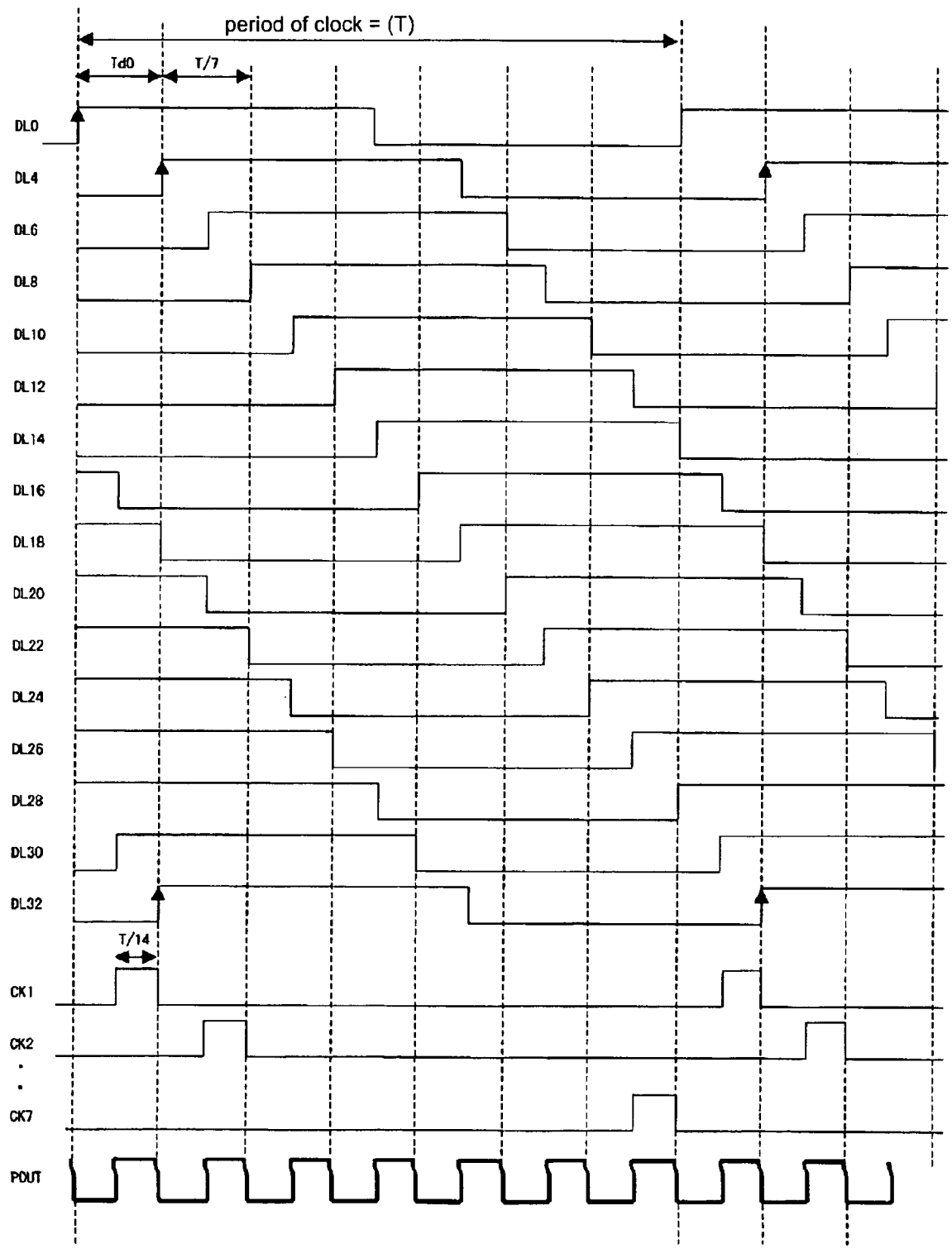
FIG. 24 is a timing chart showing the operation of a frequency multiplier circuit shown in FIG. 23.

FIG. 24 is a timing chart showing the operation of the frequency multiplier circuit shown in FIG. 23.

In order to generate the pulse output POUT from the sampling clock signals CK1 through CK7 obtained form the DLL circuit 10, the simple digital combination circuit (a logical addition circuit) 30 can be utilized. By increasing the number of stages of the unit delay circuits in the delay circuit 500, n-fold (n is a natural number) can be realized.

As described above, according to the semiconductor device of the present invention, since the delay amount of the output clock signal from the DLL circuit with respect to the input clock signal to the DLL circuit is maintained even when the input clock frequency alters, the setup time and the hold time of the input data are stably provided.

The present invention is not limited to the preferred embodiments described above, but can be implemented by modifying each of the embodiments within a range in which the spirit or scope of the present invention is maintained.

INDUSTRIAL APPLICABILITY

Since image data and clock signals in semiconductor devices can be transmitted with small vibration amplitude to reduce unnecessary electromagnetic radiation noises as well as to be durable against foreign noises from the environment, the invention can be advantageously applied not only to liquid crystal display devices or printer devices but also to small sized portable electronic equipment.

What is claimed is:

1. A semiconductor device comprising:
   a delay circuit including 2n (n is a natural number) unit delay circuits for delaying an input clock signal (with the period of T) in accordance with a delay amount setting signal for controlling the delay amount and generating and outputting 2n phases of delayed clock signals;
   a phase locked circuit for locking phases of two of the outputs from the delay circuit to be in phase with each other and for outputting the delay amount setting signal for causing each of the first to the last stages of the unit delay circuits to delay the phase of an output clock signal by T/2n;
   a correction circuit to which the input clock signal and the delay amount setting signal are input for generating a corrected clock signal by delaying the input clock signal, and outputting the corrected clock signal to the delay circuit; and
   a bias circuit for generating first and second delay amount setting signals in accordance with the delay amount control signal and supplying the first and the second delay amount setting signals to the delay circuit, wherein the first and the second delay amount setting signals control an amount of current flowing through at least one of the unit delay circuits.

2. The semiconductor device according to claim 1, further comprising:
a sampling signal generating circuit for generating a sampling signal that takes a first level between (2m-1)T/2n and mT/n (m is a natural number) based on at least two of the delayed clock signals.

3. The semiconductor device according to claim 1, wherein the correction circuit comprises:
a delay amount control circuit to which the delay amount setting signal is input for outputting a delay amount control signal; and
a clock correction circuit to which the input clock signal and the delay amount control signal are input for generating the corrected clock signal and outputting the corrected clock signal to the delay circuit.

4. The semiconductor device according to claim 3, wherein the clock correction circuit includes a variable resistor, and the delay amount control circuit includes a circuit for controlling a bias of the variable resistor.

5. The semiconductor device according to claim 3, wherein the clock correction circuit includes a current control device, and the delay amount control circuit includes a circuit for controlling a bias of the current control device.

6. The semiconductor device according to claim 1, wherein the correction circuit generates and outputs the corrected clock signal in accordance with the frequency of the input clock signal.

7. The semiconductor device according to claim 1, wherein the correction circuit generates and outputs the corrected clock signal in accordance with the delay amount setting signal.

8. The semiconductor device according to claim 1, wherein the delay circuit comprises:
a sub-delay circuit including at least one of the unit delay circuits to which the corrected clock signal is input; and
a main-delay circuit comprising 2n of the unit delay circuits to which an output of the sub-delay circuit is input for generating and outputting 2n phases of the delayed clock signals.

9. A semiconductor device comprising:
a delay circuit including an even number of unit delay circuits, the delay circuits:
delaying an input clock signal according to a delay amount setting signal; and
generating and outputting the even number of phases of delayed clock signals;
a phase locked circuit locking phases of two of the outputs from the unit delay circuits in phase with each other, the phase locked circuit outputting the delay amount setting signal causing each of the first to the last stages of the unit delay circuits to delay the phase of an output clock signal by (the period of the input clock signal)/(the number of unit delay circuits);
a correction circuit to which the input clock signal and the delay amount setting signal are input, the correction circuit generating a corrected clock signal by delaying the input clock signal and outputting the corrected clock signal to the delay circuit; and a bias circuit for generating first and second delay amount setting signals in accordance with the delay amount control signal and supplying the first and the second delay amount setting signals to the delay circuit,
wherein the first and the second delay amount setting signals control an amount of current flowing through at least one of the unit delay circuits.

10. A receiver circuit comprising:
a delay circuit including 2n (n is a natural number) unit delay circuits for delaying an input clock signal (with the period of T) in accordance with a delay amount setting signal for controlling the delay amount and generating and outputting 2n phases of delayed clock signals;
a phase locked circuit for locking phases of two of the outputs from the delay circuit to be in phase with each other and for outputting the delay amount setting signal for causing each of the first to the last stages of the unit delay circuits to delay the phase of an output clock signal by T/2n;
a correction circuit to which the input clock signal and the delay amount setting signal are input for generating a corrected clock signal by delaying the input clock signal, and outputting the corrected clock signal to the delay circuit; and
a bias circuit for generating first and second delay amount setting signals in accordance with the delay amount control signal and supplying the first and the second delay amount setting signals to the delay circuit,
wherein the first and the second delay amount setting signals control an amount of current flowing through at least one of the unit delay circuits.

11. A frequency multiplier circuit comprising:
a delay circuit including 2n (n is a natural number) unit delay circuits for delaying an input clock signal (with the period of T) in accordance with a delay amount setting signal for controlling the delay amount and generating and outputting 2n phases of delayed clock signals;
a phase locked circuit for locking phases of two of the outputs from the delay circuit to be in phase with each other and for outputting the delay amount setting signal for causing each of the first to the last stages of the unit delay circuits to delay the phase of an output clock signal by T/2n;
a correction circuit to which the input clock signal and the delay amount setting signal are input for generating a corrected clock signal by delaying the input clock signal, and outputting the corrected clock signal to the delay circuit; and
a bias circuit for generating first and second delay amount setting signals in accordance with the delay amount control signal and supplying the first and the second delay amount setting signals to the delay circuit,
wherein the first and the second delay amount setting signals control an amount of current flowing through at least one of the unit delay circuits.

* * * * *